US012794458B2

(12) United States Patent
Li

(10) Patent No.: US 12,794,458 B2
(45) Date of Patent: Nov. 10, 2026

(54) SIGNAL PROCESSING CIRCUIT, SIGNAL PROCESSING METHOD, AND ELECTRONIC DEVICE

(71) Applicant: HUAWEI TECHNOLOGIES CO., LTD., Shenzhen (CN)

(72) Inventor: Qiang Li, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 80 days.

(21) Appl. No.: 19/057,225

(22) Filed: Feb. 19, 2025

(65) Prior Publication Data

US 2025/0192762 A1 Jun. 12, 2025

Related U.S. Application Data

(63) Continuation of application No. PCT/CN2023/112038, filed on Aug. 9, 2023.

(30) Foreign Application Priority Data

Aug. 23, 2022 (CN) ......................... 202211010623.8
Sep. 30, 2022 (CN) ......................... 202211214385.2

(51) Int. Cl.
*H03K 5/00* (2006.01)
*H03D 7/00* (2006.01)
*H03K 5/1252* (2006.01)

(52) U.S. Cl.
CPC ........... *H03K 5/00006* (2013.01); *H03D 7/00* (2013.01); *H03K 5/1252* (2013.01); *H03K 2005/00286* (2013.01)

(58) Field of Classification Search
CPC ......................... H03K 5/00006; H03K 5/1252
See application file for complete search history.

(56) References Cited

U.S. PATENT DOCUMENTS

| | | | | |
|---|---|---|---|---|
| 11,536,758 | B2 * | 12/2022 | Wardlaw | G01H 13/00 |
| 2003/0224740 | A1 * | 12/2003 | Takano | H04L 27/2017 455/93 |

(Continued)

FOREIGN PATENT DOCUMENTS

| | | | |
|---|---|---|---|
| CN | 101267416 | A | 9/2008 |
| CN | 107735975 | A | 2/2018 |
| CN | 110235420 | A | 9/2019 |

(Continued)

*Primary Examiner* — Sibin Chen
(74) *Attorney, Agent, or Firm* — Maier & Maier, PLLC

(57) ABSTRACT

A signal processing circuit, a signal processing method, and an electronic device, and are applied to the field of wireless communication transmission technologies. The signal processing circuit down-converts, by using a local oscillator signal, a radio frequency signal obtained through frequency shift keying modulation into an intermediate frequency signal, converts, by using a frequency-to-amplitude converter, a frequency signal carried in the intermediate frequency signal into a first amplitude signal, and then performs demodulation based on an amplitude value of the first amplitude signal to obtain corresponding data information. This improves precision of the data information obtained, through demodulation, from the radio frequency signal obtained through frequency shift keying modulation.

20 Claims, 15 Drawing Sheets

(56) References Cited

U.S. PATENT DOCUMENTS

| | | | | |
|---|---|---|---|---|
| 2010/0203855 | A1* | 8/2010 | Komiyama ............ | H04H 40/18 455/150.1 |
| 2013/0335146 | A1* | 12/2013 | Takahashi ............ | H03G 3/3068 330/279 |

FOREIGN PATENT DOCUMENTS

| | | | |
|---|---|---|---|
| CN | 110798300 | A | 2/2020 |
| CN | 109314929 | B | 5/2021 |
| JP | 2009005046 | A | 1/2009 |
| JP | 2009302862 | A | 12/2009 |

* cited by examiner

SIGNAL PROCESSING CIRCUIT, SIGNAL PROCESSING METHOD, AND ELECTRONIC DEVICE

CROSS-REFERENCE TO RELATED APPLICATIONS

This application is a continuation of International Application No. PCT/CN2023/112038, filed on Aug. 9, 2023, which claims priority to Chinese Patent Application No. 202211010623.8, filed on Aug. 23, 2022 and Chinese Patent Application No. 202211214385.2, filed on Sep. 30, 2022. All of the aforementioned patent applications are hereby incorporated by reference in their entireties.

TECHNICAL FIELD

The embodiments relate to the field of wireless communication transmission technologies, and to a signal processing circuit, a signal processing method, and an electronic device.

BACKGROUND

In wireless communication transmission, a transmit end transmits a radio frequency signal to a receive end, where data information is modulated into the radio frequency signal. The receive end demodulates the received radio frequency signal to obtain the data information.

A common modulation scheme is frequency shift keying (FSK). In this modulation technology, data information is modulated into a radio frequency signal in a form of frequency signals with different frequency values. Correspondingly, a common demodulation scheme is as follows: a frequency mixer, a crystal oscillator, and a frequency-to-amplitude converter are disposed at a receive end. The crystal oscillator provides a local oscillator signal for the frequency mixer. The frequency mixer performs frequency mixing on an input radio frequency signal and the local oscillator signal to obtain an intermediate frequency signal, where the intermediate frequency signal carries frequency signals that have different frequencies and that indicate data information. Then the frequency-to-amplitude converter converts the frequency signals with different frequency values that are carried in the intermediate frequency signal into amplitude signals with different amplitude values, where the amplitude signals with different amplitude values indicate corresponding data information. However, during actual application, the local oscillator signal provided by the crystal oscillator has a specific frequency tolerance due to device precision or other causes. The frequency tolerance causes interference to precision of converting a frequency signal into an amplitude signal by the frequency-to-amplitude converter. When a frequency offset is large, the receive end even cannot properly perform demodulation.

SUMMARY

Embodiments provide a signal processing circuit, a signal processing method, and an electronic device, to reduce impact of a frequency tolerance of a local oscillator signal on demodulation.

To achieve the foregoing objective, the following solutions are used in embodiments.

According to a first aspect, a signal processing circuit is provided. The signal processing circuit includes a controller, a frequency mixer, a frequency generator, a frequency-to-amplitude converter, and an amplitude detector. The frequency generator is coupled to the frequency mixer. The frequency mixer is coupled to the frequency-to-amplitude converter. The frequency-to-amplitude converter is coupled to the amplitude detector. The amplitude detector and the frequency generator are separately coupled to the controller. The frequency generator is configured to output a first local oscillator signal with a frequency tolerance to the frequency mixer. The frequency mixer is configured to input a radio frequency signal and the first local oscillator signal, and perform frequency mixing on the radio frequency signal and the first local oscillator signal to obtain an intermediate frequency signal. The intermediate frequency signal carries a frequency signal. The frequency-to-amplitude converter is configured to obtain a first amplitude signal based on the frequency signal. The amplitude detector is configured to obtain an amplitude value of the first amplitude signal. The controller is configured to: obtain a value of the frequency tolerance based on an amplitude value of the first amplitude signal and an amplitude value of a second amplitude signal, where the second amplitude signal is an amplitude signal corresponding to a frequency signal carried in a second local oscillator signal, and the second local oscillator signal does not carry the frequency tolerance; and control, based on the value of the frequency tolerance, the frequency generator to adjust a frequency value of the output first local oscillator signal.

In this embodiment, in a scenario in which a frequency shift keying technology is used, a frequency-to-amplitude converter needs to be used when a receiving device performs demodulation. The frequency-to-amplitude converter converts an input frequency signal into an output amplitude signal. In an ideal case, a frequency of an input signal is in a linear relationship with an amplitude of an output signal. However, in an actual device, a frequency signal and an amplitude signal are not exactly in a linear relationship. For different frequency-to-amplitude converters, as an electronic component for converting a frequency signal into an amplitude signal, the frequency-to-amplitude converter has a specific linear operation interval regardless of a range of frequency signals to be converted. The frequency-to-amplitude converter can convert only a frequency signal whose frequency is within the linear operation interval into an amplitude signal that is in a linear relationship with the frequency signal. For a frequency signal that exceeds the linear operation interval by a specific range, a frequency value of the frequency signal and an amplitude value of an amplitude signal begin to have a nonlinear relationship. The frequency interval is referred to as a nonlinear operation interval. When a frequency difference between a frequency value of a frequency signal and the linear operation interval is quite large, the frequency-to-amplitude converter even operates within a saturated operation interval. Within the saturated interval, although the frequency value of the frequency signal changes, an amplitude value of an amplitude signal that is obtained through conversion by the frequency-to-amplitude converter may not change correspondingly, or may change slightly. When the frequency tolerance of the first local oscillator signal makes a frequency value of the frequency signal in the intermediate frequency signal fall within the linear operation interval or the nonlinear operation interval, the amplitude value of the first amplitude signal that is obtained through conversion by the frequency-to-amplitude converter and the frequency value of the frequency signal have a specific correspondence. The value of the frequency tolerance may be calculated based on the correspondence (when the frequency value of the frequency signal is within the linear operation interval, the frequency value and the amplitude value are in a linear relationship; or when the frequency value of the frequency signal is within the nonlinear operation interval, there is a specific deviation between the frequency value and the amplitude value, but the value of the frequency tolerance can still be estimated) and an amplitude value corresponding to the second local oscillator signal. The frequency value of the first local oscillator signal is adjusted based on the value of the frequency tolerance to compensate for the frequency tolerance. In this way, both a frequency value of the intermediate frequency signal and the frequency value of the frequency signal are within the linear operation interval of the frequency-to-amplitude converter. This reduces impact of the frequency tolerance on demodulation.

In a possible implementation, for the frequency-to-amplitude converter, when a frequency value of a frequency signal input to the frequency-to-amplitude converter is within a first frequency interval, an amplitude value of a first amplitude signal output by the frequency-to-amplitude converter is in a linear relationship with the frequency value of the frequency signal correspondingly input to the frequency-to-amplitude converter. The frequency tolerance indicates an offset between a frequency value of the first local oscillator signal and the first frequency interval. The controller is configured to: control, based on the value of the frequency tolerance, the frequency generator to adjust a frequency value of the output first local oscillator signal, so that a frequency value of the frequency signal is within the first frequency interval.

In this embodiment, when the frequency value of the frequency signal is not within the first frequency interval (such as the linear operation interval), for example, the frequency value of the frequency signal is within a second frequency interval (such as the nonlinear operation interval) or a third frequency interval (such as the saturated interval), a conversion relationship between a frequency value and an amplitude value is not a precise linear relationship. To improve processing precision, in this case, the controller may adjust a device parameter of the frequency-to-amplitude converter to extend the first frequency interval (such as the linear operation interval) of the frequency-to-amplitude converter, so that the frequency value of the frequency signal is within the first frequency interval. Then the frequency value of the frequency signal is converted to obtain the amplitude value of the first amplitude signal. In this case, the amplitude value and the frequency value are in a linear relationship. The value of the frequency tolerance can be accurately obtained based on the linear relationship.

In a possible implementation, the controller is further configured to: when an absolute value of a difference between the amplitude value of the first amplitude signal and the amplitude value of the second amplitude signal is greater than a first value, control the frequency-to-amplitude converter to extend an interval range of the first frequency interval.

In this embodiment, when the absolute value of the difference between the amplitude value of the first amplitude signal and the amplitude value of the second amplitude signal is greater than the first value, the controller may determine that the frequency value of the frequency signal is not within the first frequency interval. In this case, the frequency-to-amplitude converter may be controlled to extend the interval range of the first frequency interval.

In a possible implementation, the controller is further configured to: when the frequency value of the frequency signal is within the first frequency interval and a first ratio is greater than a second value, control the frequency-to-amplitude converter to narrow the interval range of the first frequency interval, where the first ratio is a ratio of a third value to a fourth value, the third value is a minimum difference between the frequency value of the frequency signal and an interval point frequency of the first frequency interval, and the fourth value is a maximum difference between the frequency value of the frequency signal and an interval center frequency of the first frequency interval.

In this embodiment, the first ratio may describe a degree of proximity between the frequency value of the frequency signal and the interval point frequency within the first frequency interval. A larger first ratio indicates a larger distance between the frequency value of the frequency signal and the interval point frequency. This indicates that the current first frequency interval is large.

In a possible implementation, the controller is further configured to: when a first frequency difference is less than a fifth value, control the frequency-to-amplitude converter to narrow the interval range of the first frequency interval, where the first frequency difference is an absolute value of a difference between a maximum frequency value and a minimum frequency value of a frequency signal carried in the first local oscillator signal.

In this embodiment, the first frequency difference is the difference between the maximum frequency value and the minimum frequency value of the frequency signal. A smaller first frequency difference indicates a smaller difference between different amplitude values of the first amplitude signal obtained through conversion, and indicates that higher demodulation precision is needed for the first amplitude signal. Therefore, when the first frequency difference is less than the preset fifth value, the controller may control the frequency-to-amplitude converter to narrow the interval range of the first frequency interval, to improve demodulation performance.

In a possible implementation, the frequency-to-amplitude converter includes a phase shift circuit and a multiplication circuit. An input end of the phase shift circuit and a first input end of the multiplication circuit are separately coupled to an output end of the frequency mixer and are configured to input the frequency signal. An output end of the phase shift circuit is coupled to a second input end of the multiplication circuit. An output end of the multiplication circuit is coupled to the amplitude detector as an output end of the frequency-to-amplitude converter. The phase shift circuit is configured to perform phase shift on the frequency signal input to the phase shift circuit, to obtain a phase-shifted frequency signal. The multiplication circuit is configured to obtain the first amplitude signal by using the frequency signal input to the multiplication circuit and the phase-shifted frequency signal. The controller is configured to reduce a value of an angle at which the phase shift circuit performs phase shift on the frequency signal, to extend the interval range of the first frequency interval.

In this embodiment, the phase shift circuit has different frequency-phase responsivity for different frequency values of an input frequency signal. In other words, the phase shift circuit has different phase shift angles for frequency signals with different frequency values. A phase of a frequency signal obtained through phase shift by the phase shift circuit is different from a phase of a frequency signal that exists before the phase shift. The two frequency signals that exist before and after the phase shift may be input to the multiplication circuit for multiplication and then undergo low-pass filtering to obtain an amplitude value of the first amplitude signal. The controller reduces the value of the angle at which the phase shift circuit performs phase shift on the frequency signal, so that a linear operation interval of the phase shift circuit can be extended. In this way, the phase shift circuit can perform phase shift on a frequency signal within a larger frequency interval range, so that the frequency-to-amplitude converter can perform frequency-to-amplitude conversion on a frequency signal within a larger frequency interval. This extends the first frequency interval.

In a possible implementation, the frequency-to-amplitude converter includes a phase shift circuit and a multiplication circuit. An input end of the phase shift circuit and a first input end of the multiplication circuit are separately coupled to an output end of the frequency mixer, to input the frequency signal. An output end of the phase shift circuit is coupled to a second input end of the multiplication circuit. After low-pass filtering is performed, an output end of the multiplication circuit is coupled to the amplitude detector as an output end of the frequency-to-amplitude converter. The phase shift circuit is configured to perform phase shift on the frequency signal input to the phase shift circuit, to obtain the phase-shifted frequency signal. The multiplication circuit is configured to obtain the first amplitude signal by using the frequency signal input to the multiplication circuit and the phase-shifted frequency signal. The controller is configured to increase a value of an angle at which the phase shift circuit performs phase shift on the frequency signal, to narrow the interval range of the first frequency interval.

In this embodiment, the phase shift circuit has different frequency-phase responsivity for different frequency values of an input frequency signal. In other words, the phase shift circuit has different phase shift angles for frequency signals with different frequency values. A phase of a frequency signal obtained through phase shift by the phase shift circuit is different from a phase of a frequency signal that exists before the phase shift. Two frequency signals with different phases may be input to the multiplication circuit for multiplication and then undergo low-pass filtering to obtain an amplitude value of the first amplitude signal. A plurality of phase-shifted frequency signals that are obtained through phase shift by the phase shift circuit and then output by the phase shift circuit may be multiplied by the frequency signal that exists before the phase shift to obtain a plurality of first amplitude signals with different amplitude values. The controller increases the value of the angle at which the phase shift circuit performs phase shift on the frequency signal, so that a size of a linear operation interval of the phase shift circuit can be reduced. In this way, the phase shift circuit can perform phase shift on a frequency signal within a smaller frequency interval range, so that the frequency-to-amplitude converter can perform frequency-to-amplitude conversion on a frequency signal within a smaller frequency interval. This narrows the first frequency interval.

In a possible implementation, the phase shift circuit includes a first capacitor, a second capacitor, a first inductor, and a first adjustable resistor. A first end of the first capacitor is coupled to the output end of the frequency mixer as an input end of the phase shift circuit. A second end of the first capacitor is coupled to a first end of the second capacitor, a first end of the first inductor, and a first end of the first adjustable resistor. A second end of the second capacitor, a second end of the first inductor, and a second end of the first adjustable resistor are grounded. The second end of the first capacitor is coupled to the multiplication circuit as an output end of the phase shift circuit. The controller is configured to adjust a resistance of the first adjustable resistor, to adjust the value of the angle at which the phase shift circuit performs phase shift on the frequency signal.

In this embodiment, the phase shift circuit includes the first capacitor and a resonant circuit that are connected in series. A coupling point between the first capacitor and the resonant circuit is coupled to the second input end of the multiplication circuit as the output end of the phase shift circuit. The resonant circuit includes the second capacitor, the first inductor, and the first adjustable resistor that are connected in parallel. A resonance frequency of the resonant circuit is as follows:

$$\omega_0 = 2\pi f_3 = \frac{1}{\sqrt{LC}},$$

where $f_3$ is a resonance frequency value, L is an inductance of the first inductor, and C is a capacitance of the second capacitor. A phase shift angle of the phase shift circuit for a frequency signal with an input frequency value of $f_3$ is 90°. A calculation formula for a phase shift angle $\Delta\varphi(f)$ for a frequency signal with another input frequency value is as follows:

$$\Delta\varphi(f) = \frac{\pi}{2} - 2Q_p\frac{f - f_3}{f_3}.$$

In the formula, f is a frequency value of a frequency signal input to the phase shift circuit, $f_3$ is a resonance frequency value, and is a frequency value of a frequency signal obtained through 90°-phase-shift by the phase shift circuit, and $Q_p$ is a phase shift slope of the phase shift circuit, and determines a range of phase shift angles for frequency signals with different frequency values. $Q_p=2\pi f_3RC$, where R is a resistance of the first adjustable resistor, and C is a capacitance of the second capacitor. Therefore, the phase shift slope of the phase shift circuit can be adjusted by adjusting a value of the resistance of the first adjustable resistor. It can be understood from the foregoing formula that the phase shift circuit can perform phase shift on a frequency signal only by a specific phase interval range. A larger phase shift slope indicates a smaller available range of the frequency value f. On the contrary, a smaller phase shift slope indicates a larger available range of the frequency value f. Therefore, a range of a linear operation interval within which the phase shift circuit can perform phase shift may be adjusted by adjusting the phase shift slope of the phase shift circuit. In this way, a range of the linear operation interval, such as a range of the first frequency interval, of the frequency-to-amplitude converter is adjusted.

In a possible implementation, the frequency-to-amplitude converter further includes a first comparator. A first input end of the first comparator is coupled to the output end of the phase shift circuit. A second input end of the first comparator is configured to input a reference voltage. An output end of the first comparator is coupled to the second input end of the multiplication circuit.

In this embodiment, the first comparator compares a phase-shifted frequency signal input to the first input end with the reference voltage. When a signal amplitude (such as a voltage value) of the phase-shifted frequency signal is greater than or equal to the reference voltage, the first comparator outputs a signal with a fixed first amplitude value. When a signal amplitude of the phase-shifted frequency signal is less than the reference voltage, the first comparator outputs a signal with a fixed second amplitude value. The signal with the fixed first amplitude value and/or the signal with the fixed first amplitude value that are output by the first comparator form a first shaped signal.

In a possible implementation, a center frequency value of the intermediate frequency signal is equal to the interval center frequency of the first frequency interval.

In this embodiment, during actual application, a frequency value of the frequency signal carried in the first local oscillator signal can change by using the first local oscillator signal as a center frequency, for example, during modulation and demodulation of binary data information. The center frequency value of the intermediate frequency signal is 1 MHz. The frequency signal carried in the first local oscillator signal has two different frequency values: a frequency value $f_0$ and a frequency value $f_1$. A value of the frequency value $f_0$ may be as follows: 1 MHz-0.01 MHz-0.99 MHz. A value of the frequency value $f_1$ may be as follows: 1 MHz+0.01 MHz=1.01 MHz. In fourth-order frequency shift keying, eighth-order frequency shift keying, or other modulation schemes, more frequency values may alternatively be added to correspond to values for different modulation orders. In this case, when the center frequency value of the intermediate frequency signal is the interval center frequency $f_3$ of the first frequency interval, it can be better ensured that all frequency values of the frequency signal fall within the first frequency interval during adjustment of a size of the interval range of the first frequency interval. In addition, signal amplitudes of a phase-shifted frequency signal obtained by the phase shift circuit by performing phase shift on the frequency signal are consistent. Therefore, when a first amplitude signal is obtained through multiplication by the multiplication circuit, absolute values of signal amplitudes of the first amplitude information that correspond to the frequency values are also consistent. For example, if an amplitude value corresponding to the frequency value $f_3$ is 0, an amplitude value corresponding to the frequency value $f_0$ may be −1, and an amplitude value corresponding to the frequency value $f_1$ may be 1. Absolute values of the signal amplitudes corresponding to the two frequency values are both 1. In this case, the obtained first amplitude signal is also a regularly symmetric signal. A data information result obtained by an amplitude converter by converting the first amplitude signal is also more accurate.

In a possible implementation, the signal processing circuit further includes an amplitude converter. The amplitude converter is coupled to the output end of the frequency-to-amplitude converter and is configured to obtain corresponding data information based on the amplitude value of the first amplitude signal.

In this embodiment, an implementation principle of the amplitude converter is similar to an implementation principle of an analog-to-digital converter. The amplitude converter converts the first amplitude signal, such as an analog signal, into data information, such as a digital signal, based on different amplitude values of the first amplitude signal.

In a possible implementation, the signal processing circuit further includes a low-pass filter. An input end of the amplitude detector and an input end of the amplitude converter are coupled to the output end of the frequency-to-amplitude converter through the low-pass filter.

In this embodiment, a first amplitude signal obtained by some frequency-to-amplitude converters by converting a frequency value into an amplitude value may have a high-frequency component. The high-frequency component causes interference to operation of the amplitude converter. Therefore, the low-pass filter is used to filter out the high-frequency component.

In a possible implementation, the signal processing circuit further includes a first band-pass filter. The frequency-to-amplitude converter is coupled to the output end of the frequency mixer through the first band-pass filter. The controller is further configured to increase bandwidth of the first band-pass filter or reduce bandwidth of the first band-pass filter based on the value of the frequency tolerance.

In this embodiment, intermediate frequency signals may be classified into three types: a broadband intermediate frequency signal, a mid-band intermediate frequency signal, and a narrowband intermediate frequency signal. During actual application, the broadband intermediate frequency signal and the mid-band intermediate frequency signal can share a band-pass filter because a difference between frequency values is small. With the first band-pass filter disposed, different operation modes may be selected. For example, the first band-pass filter is used to filter out an intermediate frequency signal other than the mid-band intermediate frequency signal, or filter out an intermediate frequency signal other than the broadband intermediate frequency signal.

In a possible implementation, the signal processing circuit further includes a first amplifier. An input end of the first band-pass filter is coupled to the output end of the frequency mixer through the first amplifier.

In this embodiment, the first amplifier is configured to amplify the intermediate frequency signal output by the frequency mixer, to improve signal quality of the intermediate frequency signal.

In a possible implementation, the signal processing circuit further includes a receiving unit. The receiving unit is configured to receive the radio frequency signal and output the radio frequency signal to the frequency mixer.

In this embodiment, the receiving unit is configured to receive the radio frequency signal and output the received radio frequency signal to the frequency mixer.

In a possible implementation, the receiving unit includes a second band-pass filter and a second amplifier. The second band-pass filter is coupled to the frequency mixer through the second amplifier. The second band-pass filter is configured to receive the radio frequency signal.

In this embodiment, the radio frequency signal received by the receiving unit may include a signal from another channel, and the second band-pass filter is used to filter out the signal from the another channel. The second amplifier amplifies the radio frequency signal to improve signal quality of the radio frequency signal, so that processing effect of performing, by the frequency mixer, down-conversion on the radio frequency signal based on the first local oscillator signal to obtain the intermediate frequency signal is better.

According to a second aspect, an embodiment further provides a signal processing circuit. The signal processing circuit includes a phase shift circuit, a multiplication circuit, and a shaping circuit. An input end of the phase shift circuit and a first input end of the multiplication circuit each are configured to input one data signal. The data signal carries a frequency signal. An output end of the phase shift circuit is coupled to a first input end of the shaping circuit. An output end of the shaping circuit is coupled to a second input end of the multiplication circuit. An output end of the multiplication circuit serves as an output end of the signal processing circuit. The phase shift circuit is configured to perform phase shift on one data signal input to the phase shift circuit, to obtain a phase-shifted data signal. The shaping circuit is configured to obtain a first shaped signal based on the phase-shifted carrier signal, where the first shaped signal includes a plurality of fixed amplitude values. The multiplication circuit is configured to obtain an amplitude signal based on one data signal input to the multiplication circuit and the first shaped signal, where an amplitude value of the amplitude signal indicates a frequency value corresponding to the frequency signal.

In this embodiment, the data signal may be a baseband signal, an intermediate frequency signal, a radio frequency signal, or the like.

In a possible implementation, the shaping circuit further includes a first comparator. A first input end of the first comparator is coupled to the output end of the phase shift circuit. A second input end of the first comparator is configured to input a reference voltage. An output end of the first comparator is coupled to the second input end of the multiplication circuit.

In a possible implementation, the phase shift circuit includes a first capacitor, a second capacitor, a first inductor, and a first resistor. A first end of the first capacitor is configured to input one data signal as the input end of the phase shift circuit. A second end of the first capacitor is coupled to a first end of the second capacitor, a first end of the first inductor, and a first end of the first resistor. A second end of the second capacitor, a second end of the first inductor, and a second end of the first resistor are grounded. The second end of the first capacitor is coupled to the shaping circuit as the output end of the phase shift circuit.

According to a third aspect, an embodiment further provides a signal processing method based on a signal processing circuit. The signal processing circuit includes a frequency mixer, a frequency generator, a frequency-to-amplitude converter, and an amplitude detector. The frequency generator is coupled to the frequency mixer. The frequency mixer is coupled to the frequency-to-amplitude converter. The frequency-to-amplitude converter is coupled to the amplitude detector. The frequency generator is configured to output a first local oscillator signal with a frequency tolerance to the frequency mixer. The frequency mixer is configured to input a radio frequency signal and the first local oscillator signal, and perform frequency mixing on the radio frequency signal and the first local oscillator signal to obtain an intermediate frequency signal. The intermediate frequency signal carries a frequency signal. The frequency-to-amplitude converter is configured to obtain a first amplitude signal based on the frequency signal. The amplitude detector is configured to obtain an amplitude value of the first amplitude signal. The method includes: obtaining a value of the frequency tolerance based on an amplitude value of the first amplitude signal and an amplitude value of a second amplitude signal, where the second amplitude signal is an amplitude signal corresponding to a frequency signal carried in a second local oscillator signal, and the second local oscillator signal does not carry the frequency tolerance; and controlling, based on the value of the frequency tolerance, the frequency generator to adjust a frequency of the output first local oscillator signal.

In a possible implementation, for the frequency-to-amplitude converter, when a frequency value of a frequency signal input to the frequency-to-amplitude converter is within a first frequency interval, an amplitude value of a first amplitude signal output by the frequency-to-amplitude converter is in a linear relationship with the frequency value of the frequency signal correspondingly input to the frequency-to-amplitude converter. The frequency tolerance indicates an offset between a frequency value of the first local oscillator signal and the first frequency interval. The method includes: controlling, based on the value of the frequency tolerance, the frequency generator to adjust a frequency value of the output first local oscillator signal, so that a frequency value of the frequency signal is within the first frequency interval.

In a possible implementation, the method further includes: when an absolute value of a difference between the amplitude value of the first amplitude signal and the amplitude value of the second amplitude signal is greater than a first value, controlling the frequency-to-amplitude converter to extend an interval range of the first frequency interval.

In a possible implementation, the method further includes: when the frequency value of the frequency signal is within the first frequency interval and a first ratio is greater than a second value, controlling the frequency-to-amplitude converter to narrow the interval range of the first frequency interval, where the first ratio is a ratio of a third value to a fourth value, the third value is a minimum difference between the frequency value of the frequency signal and an interval point frequency of the first frequency interval, and the fourth value is a maximum difference between the frequency value of the frequency signal and an interval center frequency of the first frequency interval.

In a possible implementation, the method further includes: when a first frequency difference is less than a fifth value, controlling the frequency-to-amplitude converter to narrow the interval range of the first frequency interval, where the first frequency difference is an absolute value of a difference between a maximum frequency value and a minimum frequency value of a frequency signal carried in the first local oscillator signal.

In a possible implementation, the frequency-to-amplitude converter includes a phase shift circuit and a multiplication circuit. An input end of the phase shift circuit and a first input end of the multiplication circuit are separately coupled to an output end of the frequency mixer and are configured to input the frequency signal. An output end of the phase shift circuit is coupled to a second input end of the multiplication circuit. An output end of the multiplication circuit is coupled to the amplitude detector as an output end of the frequency-to-amplitude converter. The phase shift circuit is configured to perform phase shift on the frequency signal input to the phase shift circuit, to obtain a phase-shifted frequency signal. The multiplication circuit is configured to obtain the first amplitude signal by using the frequency signal input to the multiplication circuit and the phase-shifted frequency signal. The method includes: reducing a value of an angle at which the phase shift circuit performs phase shift on the frequency signal, to extend the interval range of the first frequency interval.

In a possible implementation, the frequency-to-amplitude converter includes a phase shift circuit and a multiplication circuit. An input end of the phase shift circuit and a first input end of the multiplication circuit are separately coupled to an output end of the frequency mixer and are configured to input the frequency signal. An output end of the phase shift circuit is coupled to a second input end of the multiplication circuit. An output end of the multiplication circuit is coupled to the amplitude detector as an output end of the frequency-to-amplitude converter. The phase shift circuit is configured to perform phase shift on the frequency signal input to the phase shift circuit, to obtain a phase-shifted frequency signal. The multiplication circuit is configured to obtain the first amplitude signal by using the frequency signal input to the multiplication circuit and the phase-shifted frequency signal. The method includes: increasing a value of an angle at which the phase shift circuit performs phase shift on the frequency signal, to narrow the interval range of the first frequency interval.

In a possible implementation, the phase shift circuit includes a first capacitor, a second capacitor, a first inductor, and a first adjustable resistor. A first end of the first capacitor is coupled to the output end of the frequency mixer as an input end of the phase shift circuit. A second end of the first capacitor is coupled to a first end of the second capacitor, a first end of the first inductor, and a first end of the first adjustable resistor. A second end of the second capacitor, a second end of the first inductor, and a second end of the first adjustable resistor are grounded. The second end of the first capacitor is coupled to the multiplication circuit as an output end of the phase shift circuit. The method includes: adjusting a resistance of the first adjustable resistor, to adjust the value of the angle at which the phase shift circuit performs phase shift on the frequency signal.

In a possible implementation, the signal processing circuit further includes a first band-pass filter. The frequency-to-amplitude converter is coupled to the output end of the frequency mixer through the first band-pass filter. The method further includes: increasing bandwidth of the first band-pass filter or reducing bandwidth of the first band-pass filter based on the value of the frequency tolerance.

According to a fourth aspect, an embodiment further provides an electronic device. The electronic device includes the signal processing circuit described in the first aspect, or includes the signal processing circuit described in the second aspect.

In some possible implementations, the electronic device is a transmitting device.

According to a fifth aspect, an embodiment further provides a chip system. The chip system includes at least one processor and at least one interface circuit. The at least one processor and the at least one interface circuit may be interconnected through a line. The processor is configured to support the chip system in implementing the method described in the third aspect. The at least one interface circuit may be configured to receive a signal from another apparatus (for example, a memory), or send a signal to another apparatus (for example, a communication interface). The chip system may include a chip, and may further include another discrete component.

According to a sixth aspect, an embodiment of further provides a non-transitory computer-readable storage medium. The non-transitory computer-readable storage medium includes instructions. When the instructions are run on the foregoing chip system or electronic device, the chip system or the electronic device is enabled to perform the method described in the third aspect.

According to a seventh aspect, an embodiment further provides a computer program product including instructions. When the instructions are run on the foregoing chip system or electronic device, the chip system or the electronic device is enabled to perform the method described in the third aspect.

For effects of the second aspect, the third aspect, the fourth aspect, the fifth aspect, the sixth aspect, and the seventh aspect, refer to related descriptions in the first aspect and the second aspect. Therefore, details are not described again.

DETAILED DESCRIPTION OF EMBODIMENTS

It should be noted that the terms "first", "second", and the like in embodiments are merely used to distinguish between features of a same type, and cannot be understood as an indication of relative importance, a quantity, a sequence, or the like.

The term "example", "for example", or the like in embodiments are used to give an example, an illustration, or a description. Any embodiment or design scheme described as an "example" or "for example" should not be construed as being more preferred or more advantageous than another embodiment or design scheme. In other words, the term "example", "for example", or the like is intended to present a related concept in a specific manner.

The terms "coupling" and "connection" in embodiments should be understood in a broad sense. For example, the "connection" may be a physical direct connection, or may be an indirect connection implemented through an electronic component, for example, a connection implemented through a resistor, an inductor, a capacitor, or another electronic component.

First, some basic concepts in embodiments are described.

In signal wireless communication, data information that needs to be transmitted is carried in a radio frequency signal through modulation, and the radio frequency signal is transmitted to a receiving device through a transmitting device. The receiving device demodulates the received radio frequency signal to obtain the data information carried in the radio frequency signal, to complete wireless communication transmission of data.

A common modulation method is frequency shift keying (FSK) modulation. In frequency shift keying modulation, data information is modulated into a radio frequency signal in a form of frequency signals with different frequency values. A receiving device obtains the different frequency values of the frequency signals from the radio frequency signal, and performs demodulation by using the different frequency values to obtain corresponding data information.

Figure 1:
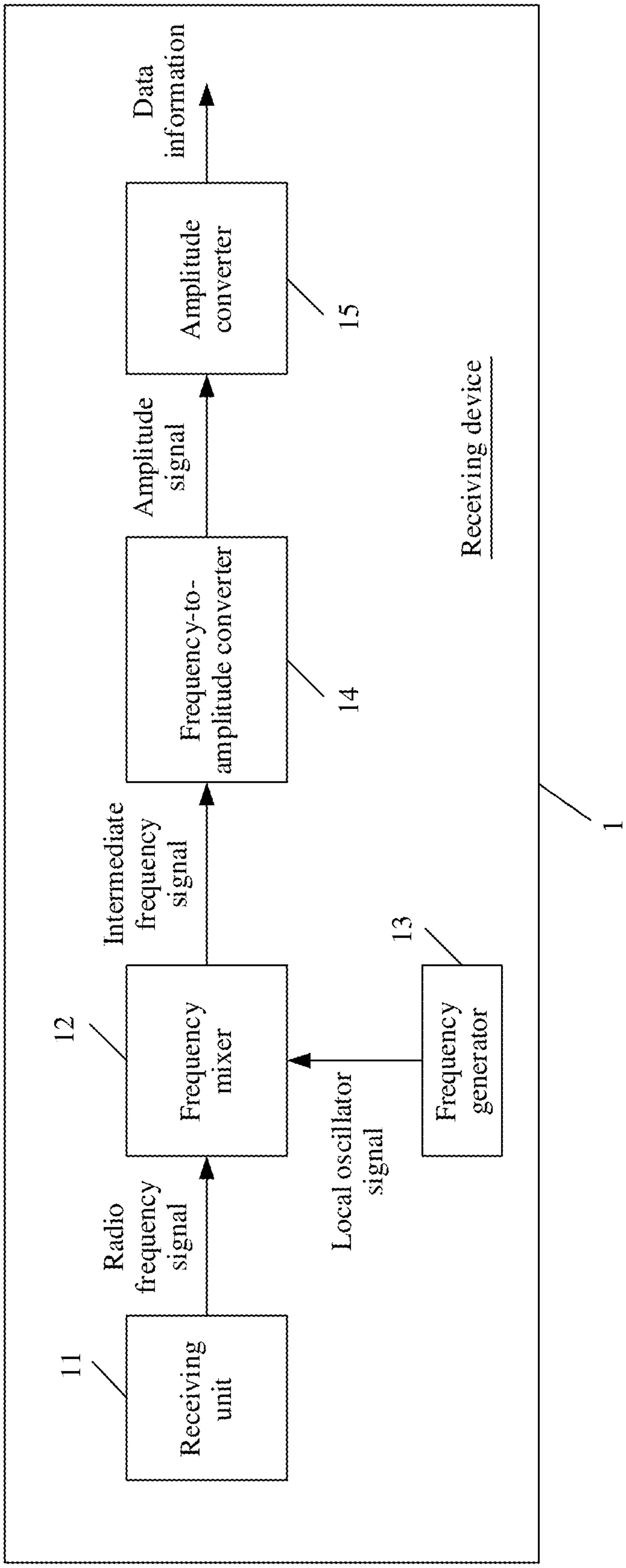
FIG. 1 is a diagram of a structure of a receiving device according to an embodiment.

An embodiment provides a receiving device. As shown in FIG. 1, the receiving device 1 includes a receiving unit 11, a frequency mixer 12, a frequency generator 13, a frequency-to-amplitude converter 14, and an amplitude converter 15. The receiving unit 11 is coupled to the frequency mixer 12. The frequency mixer 12 is coupled to the frequency generator 13 and the frequency-to-amplitude converter 14. The frequency-to-amplitude converter 14 is coupled to the amplitude converter 15. The receiving unit 11 is configured to receive a radio frequency signal, and output the received radio frequency signal to the frequency mixer 12. The radio frequency signal carries a frequency signal that indicates data information. The frequency generator 13 is configured to output, to the frequency mixer 12, a local oscillator signal that serves as a carrier signal. The frequency mixer 12 is configured to perform frequency mixing on the radio frequency signal and the local oscillator signal to obtain an intermediate frequency signal, and output the intermediate frequency signal to the frequency-to-amplitude converter 14, where the intermediate frequency signal carries the frequency signal. The frequency-to-amplitude converter 14 is configured to convert the frequency signal carried in the intermediate frequency signal into an amplitude signal, where different amplitude values of the amplitude signal indicate different frequency values of the frequency signal. The amplitude converter 15 is configured to convert the different amplitude values of the amplitude signal into data information corresponding to the different frequency values of the frequency signal.

Figure 2:
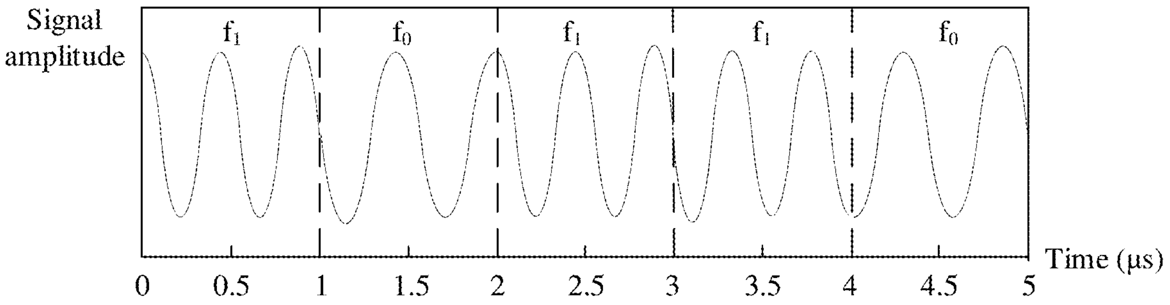
FIG. 2 is a diagram of a waveform of a frequency signal according to an embodiment.
Figure 3:
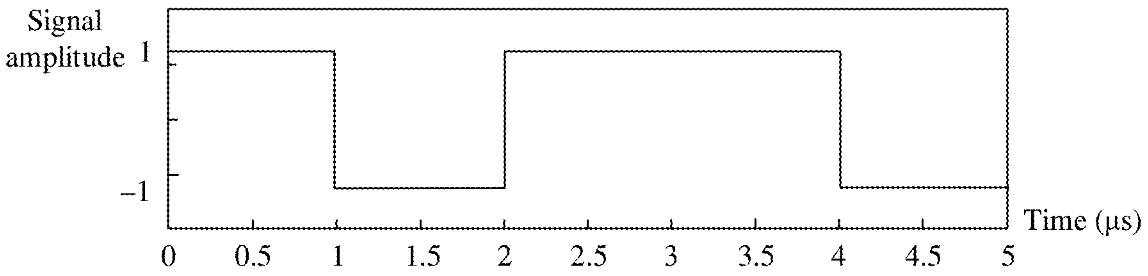
FIG. 3 is a diagram of a waveform of an amplitude signal according to an embodiment.

For example, data information that needs to be transmitted is binary data information, a frequency signal with a frequency value of $f_0$ indicates data 0, and a frequency signal with a frequency value of $f_1$ indicates data 1. In this case, for example, when binary data information 01101 needs to be transmitted, as shown in FIG. 2, a frequency signal includes five different frequency signal components, and frequency values corresponding to the five different frequency signal components from right to left are the frequency value $f_0$, the frequency value $f_1$, the frequency value $f_1$, the frequency value $f_0$, and the frequency value $f_1$. On the receiving device 1, the frequency-to-amplitude converter 14 converts the frequency value $f_0$ into an amplitude signal with an amplitude value of −1 to indicate the data 0, and converts the frequency value $f_1$ into an amplitude signal with an amplitude value of 1 to indicate the data 1, to obtain an amplitude signal corresponding to FIG. 3.

In this embodiment, the receiving device 1 also demodulates the data information through frequency shift keying. Advantages of frequency shift keying are a simple implementation and strong anti-noise and anti-attenuation capabilities. Frequency shift keying can be used in an application scenario with medium- and low-speed data transmission. However, in application, a crystal oscillator (CO) can be used as the frequency generator 13 to provide a local oscillator signal. However, the crystal oscillator can cause a frequency tolerance (FT) due to impact of a technique, ambient temperature, and other factors. In addition, in most application scenarios with medium- and low-speed data transmission, a low-cost crystal oscillator can be used. However, the low-cost crystal oscillator can cause a quite large frequency tolerance. Therefore, a frequency value of the intermediate frequency signal obtained by the frequency mixer 12 by performing frequency mixing on the radio frequency signal and the local oscillator signal also deviates from an expected value due to the frequency tolerance of the local oscillator signal, and a frequency value of the frequency signal carried in the intermediate frequency signal also deviates due to the deviation of the frequency value of the intermediate frequency signal. The frequency-to-amplitude converter 14 is configured to convert the frequency value of the frequency signal into an amplitude value of an amplitude signal. In embodiments, a conversion correspondence between the frequency value and the amplitude value can be a linear relationship only within a specific frequency interval. The frequency interval is also referred to as a linear operation interval of the frequency-to-amplitude converter 14. For a frequency value that is far greater than or less than a range of the frequency interval, an amplitude value obtained by using the frequency-to-amplitude converter 14 cannot accurately indicate a corresponding frequency value, and even no correct amplitude value may be obtained by using the frequency-to-amplitude converter 14.

Figure 4:
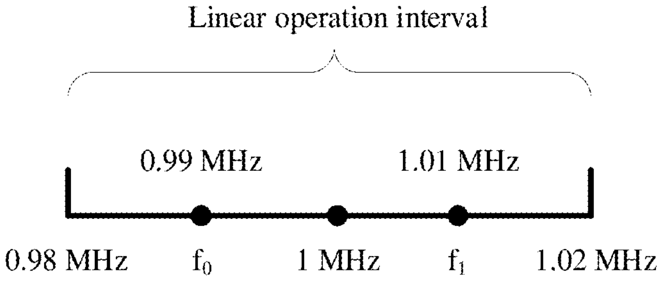
FIG. 4 is a diagram in which frequency values of a frequency signal are within a linear operation interval according to an embodiment.
Figure 5:
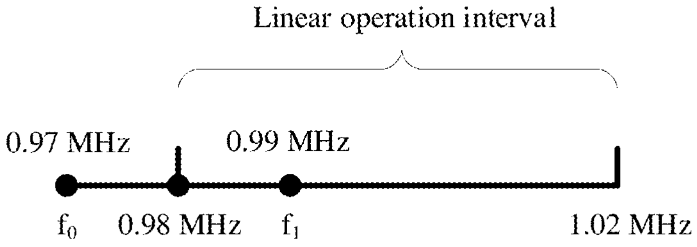
FIG. 5 is a diagram in which some frequency values of a frequency signal are beyond a linear operation interval according to an embodiment.
Figure 6:
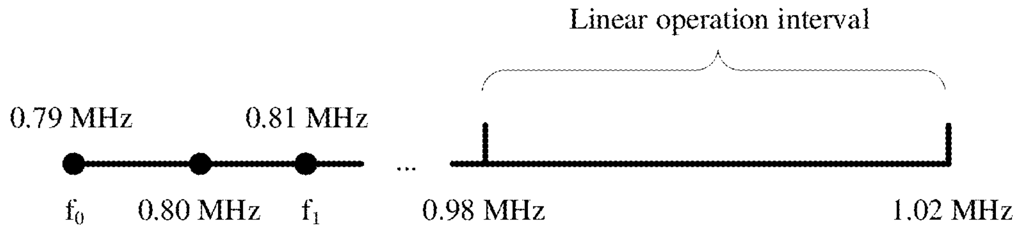
FIG. 6 is a diagram in which all frequency values of a frequency signal are beyond a linear operation interval according to an embodiment.
Figure 17:
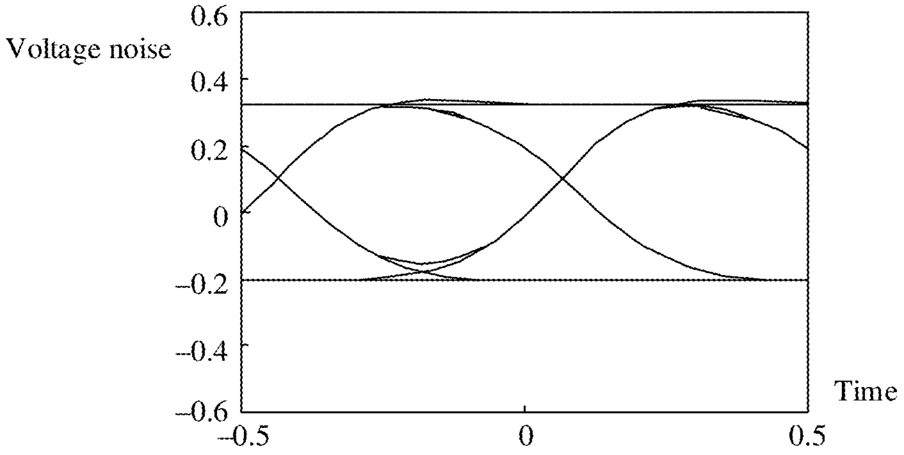
FIG. 17 is a diagram of an eye diagram of a receiving device according to an embodiment.
Figure 18:
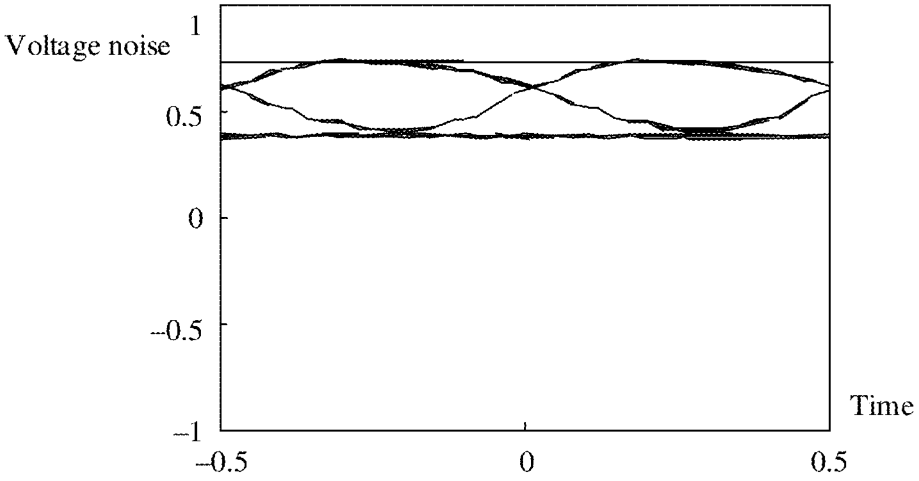
FIG. 18 is a diagram of an eye diagram of another receiving device according to an embodiment.
Figure 19:
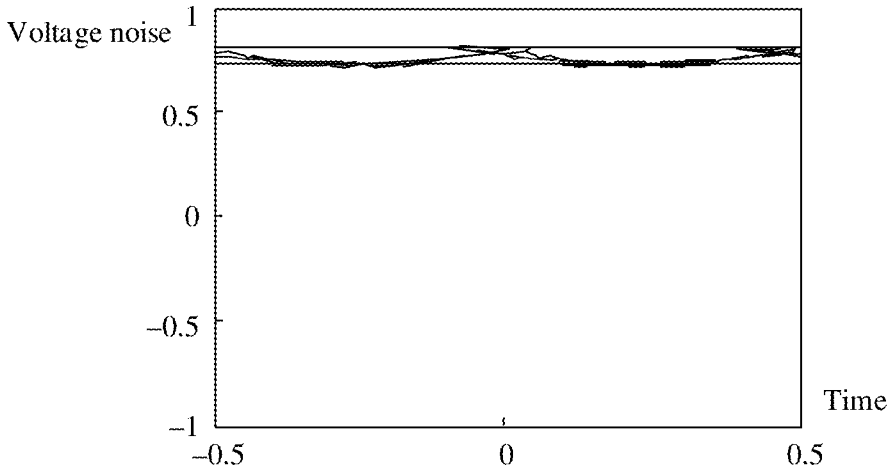
FIG. 19 is a diagram of an eye diagram of another receiving device according to an embodiment.
Figure 20:
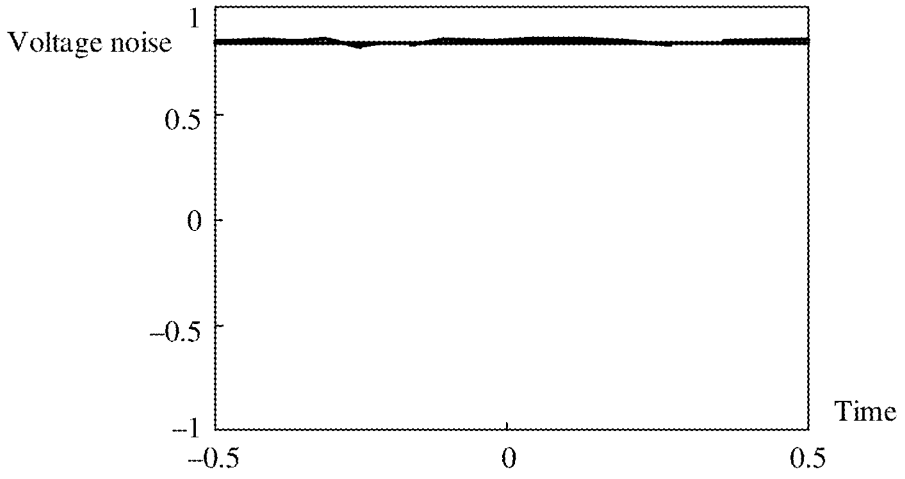
FIG. 20 is a diagram of an eye diagram of another receiving device according to an embodiment.

For example, a center frequency value of an intermediate frequency signal obtained through down-conversion is 1 MHz. A frequency value of a frequency signal $f_1$ is 1.01 MHz, and a frequency value of $f_0$ is 0.99 MHz. The linear operation interval of the frequency-to-amplitude converter 14 is 0.98 MHz to 1.02 MHz. As shown in FIG. 4, when no frequency tolerance is present on the local oscillator signal, both the frequency value of the intermediate frequency signal and the frequency value of the frequency signal are within the linear operation interval of the frequency-to-amplitude converter 14. In this case, when the frequency-to-amplitude converter 14 converts the frequency value of the frequency signal into an amplitude value of an amplitude signal, an obtained amplitude value and a corresponding frequency value are in a linear conversion relationship. For example, the amplitude value obtained through conversion can accurately indicate the frequency value of the frequency signal. As shown in FIG. 5, when a frequency tolerance is present on the local oscillator signal, where for example, the frequency tolerance is −20 kHz, an actual frequency value of a frequency midpoint of the intermediate frequency signal is 0.98 MHz. In this case, an actual frequency value $f_1$ of the frequency signal is 0.99 MHz, and an actual frequency value $f_0$ of the frequency signal is 0.97 MHz. It can be understood from FIG. 5 that, in this case, the frequency value $f_0$ of the frequency signal is not within the linear operation interval of the frequency-to-amplitude converter 14, and therefore an amplitude value of an amplitude signal that is obtained by the frequency-to-amplitude converter 14 by converting the frequency value $f_0$ of the frequency signal changes nonlinearly. The nonlinear change causes interference to a subsequent demodulation process for obtaining data information based on the amplitude value. When a difference between the frequency value of the frequency signal and the frequency interval of the frequency-to-amplitude converter 14 is larger, the nonlinear change also causes greater interference to demodulation, and even makes it unable to properly perform demodulation. For example, when the frequency tolerance is −200 kHz, as shown in FIG. 6, an actual frequency value $f_0$ of the frequency signal is 0.79 MHz, and an actual frequency value $f_1$ of the frequency signal is 0.81 MHz. In this case, because the frequency value of the frequency signal is quite far away from the linear operation interval of the frequency-to-amplitude converter 14, the frequency-to-amplitude converter 14 cannot properly process the frequency value $f_1$ and the frequency value $f_0$. FIG. 17, FIG. 18, FIG. 19, and FIG. 20 show example eye diagrams (eye diagram) of the receiving device 1 in the case of different frequency tolerances. The eye diagram may indicate demodulation performance. A larger degree of opening of a pattern in the eye diagram indicates better demodulation performance. A smaller degree of opening of a pattern in the eye diagram indicates poorer demodulation performance. FIG. 17 shows a case in which a value of a frequency tolerance is 5 kHz. In this case, the frequency value of the frequency signal has a specific offset, but this has little impact on demodulation performance. FIG. 18 shows a case in which a value of a frequency tolerance is 30 kHz. In this case, some frequency values of the frequency signal fall within a nonlinear operation interval, and the frequency tolerance has specific impact on demodulation performance. FIG. 19 shows a case in which a value of a frequency tolerance is 60 kHz. FIG. 20 shows a case in which a value of a frequency tolerance is 90 kHz. In these two cases, the frequency tolerance is large, and therefore all frequency values of the frequency signal are beyond the linear operation interval of the frequency-to-amplitude converter 14. Due to impact of the frequency tolerance, the receiving device 1 cannot properly perform demodulation.

Figure 7:
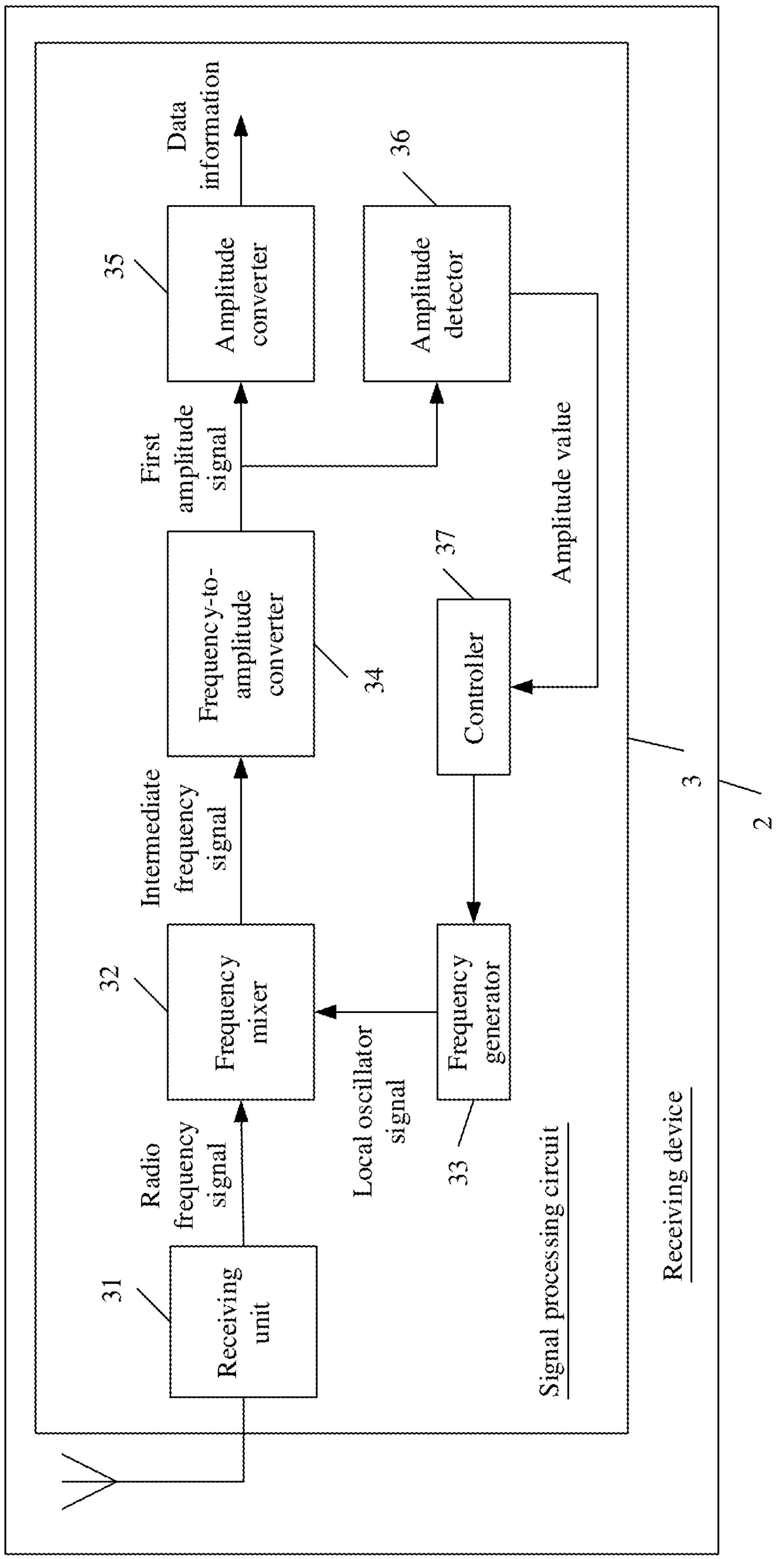
FIG. 7 is a diagram of a structure of another receiving device according to an embodiment.

To address impact of a frequency tolerance of a local oscillator signal on demodulation, an embodiment further provides a receiving device. As shown in FIG. 7, the receiving device 2 includes a signal processing circuit 3. The signal processing circuit 3 includes a receiving unit 31, a frequency mixer 32, a frequency generator 33, a frequency-to-amplitude converter 34, an amplitude converter 35, an amplitude detector 36, and a controller 37. The receiving unit 31 is coupled to the frequency mixer 32. The frequency mixer 32 is coupled to the frequency generator 33 and the frequency-to-amplitude converter 34. The frequency-to-amplitude converter 34 is coupled to the amplitude converter 35 and the amplitude detector 36. The amplitude detector 36 and the frequency generator 33 are coupled to the controller 37.

The receiving unit 31 is configured to receive a radio frequency signal, and output the radio frequency signal to the frequency mixer 32. The radio frequency signal carries a frequency signal that indicates data information. The frequency generator 33 is configured to output a first local oscillator signal to the frequency mixer 32. A frequency tolerance is present on the first local oscillator signal. The frequency mixer 32 is configured to input the radio frequency signal and the first local oscillator signal, perform down-conversion on the radio frequency signal and the first local oscillator signal to obtain an intermediate frequency signal, and output the intermediate frequency signal to the frequency-to-amplitude converter 34, where the intermediate frequency signal carries the frequency signal. The frequency-to-amplitude converter 34 is configured to convert the frequency signal carried in the intermediate frequency signal into a first amplitude signal, where different amplitude values of the first amplitude signal indicate different frequency values of the frequency signal. The amplitude converter 35 is configured to convert the different amplitude values of the first amplitude signal into corresponding data information. The amplitude detector 36 is configured to obtain an amplitude value of the first amplitude signal, and feed back the amplitude value to the controller 37. The controller 37 is configured to calculate a value of the frequency tolerance based on the amplitude value of the first amplitude signal and an amplitude value of a second amplitude signal, and control, based on the value of the frequency tolerance, the frequency generator 33 to adjust a frequency of the output first local oscillator signal.

Figure 21:
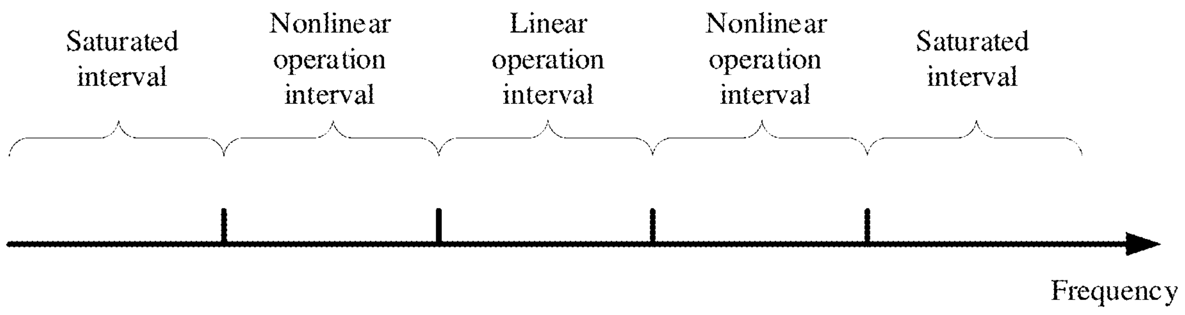
FIG. 21 is a diagram of distribution of operation intervals of a frequency-to-amplitude converter according to an embodiment.

For example, in a scenario in which a frequency shift keying technology is used, the frequency-to-amplitude converter 34 needs to be used when the receiving device 2 performs demodulation. However, a frequency signal and an amplitude signal are not parameters in an exact linear correspondence. As shown in FIG. 21, for different frequency-to-amplitude converters 34, as an electronic component for converting a frequency signal into an amplitude signal, the frequency-to-amplitude converter 34 has a specific linear operation interval regardless of a range of frequency signals to be converted. Herein, the linear operation interval may be referred to as a first frequency interval. The frequency-to-amplitude converter 34 can convert only a frequency signal within the first frequency interval into a first amplitude signal in a linear relationship with the frequency signal. For a frequency signal that exceeds the frequency interval by a specific range, a frequency value of the frequency signal and an amplitude value of a first amplitude signal begin to have a nonlinear relationship. The frequency interval is referred to as a nonlinear operation interval, and may also be referred to as a second frequency interval. When a frequency difference between a frequency value of a frequency signal and the first frequency interval is quite large, a saturated operation interval is reached, where the saturated operation interval may also be referred to as a third frequency interval. Within the saturated interval, although the frequency value of the frequency signal changes, an amplitude value of a first amplitude signal that is obtained through conversion by the frequency-to-amplitude converter 34 may not change correspondingly, or may change slightly. When the frequency tolerance of the first local oscillator signal makes a frequency value of the frequency signal in the intermediate frequency signal fall within the first frequency interval or the second frequency interval, the amplitude value of the first amplitude signal that is obtained through conversion by the frequency-to-amplitude converter 34 and the frequency value of the frequency signal have a specific correspondence. The value of the frequency tolerance may be calculated based on the correspondence (when the frequency value of the frequency signal is within the first frequency interval, the frequency value and the amplitude value are in a linear relationship; or when the frequency value of the frequency signal is within the second frequency interval, there is a specific deviation between the frequency value and the amplitude value, but the value of the frequency tolerance can still be estimated) and an amplitude value corresponding to a second local oscillator signal. The second local oscillator signal may be a preset ideal local oscillator signal without a frequency tolerance. An amplitude value of a second amplitude signal that may be obtained by the frequency-to-amplitude converter 34 by converting the second local oscillator signal is obtained through theoretical calculation. Alternatively, the second local oscillator signal may be a local oscillator signal that has an accurate frequency value and that is obtained through calibration by using a precision device, and the local oscillator signal is input to the frequency-to-amplitude converter 34 to obtain an amplitude value of a corresponding second amplitude signal. Based on the calculated value of the frequency tolerance, the frequency generator 33 is controlled to adjust a frequency value of the first local oscillator signal to be output by the frequency generator 33. For example, the frequency generator 33 outputs the first local oscillator signal, but a frequency tolerance of −0.2 MHz is present on the first local oscillator signal, and consequently, a center frequency value of the intermediate frequency signal is 0.8 MHz. In this case, the controller 37 controls the frequency generator 33 to output a frequency value, so that a center frequency value of an intermediate frequency signal actually output by the frequency mixer 32 is 1 MHz.

In this embodiment, the amplitude detector 36 obtains the amplitude value of the first amplitude signal output by the frequency-to-amplitude converter 34, and compares the amplitude value with the amplitude value of the second amplitude signal. If a frequency value of the intermediate frequency signal is within the first frequency interval (such as the linear operation interval), the value of the frequency tolerance may be calculated based on a difference obtained through comparison. If a frequency value of the intermediate frequency signal is within the second frequency interval (such as the nonlinear operation interval), the value of the frequency tolerance may also be estimated. The frequency value of the first local oscillator signal is adjusted based on the obtained value of the frequency tolerance, to reduce impact of the frequency tolerance on modulation.

Figure 8:
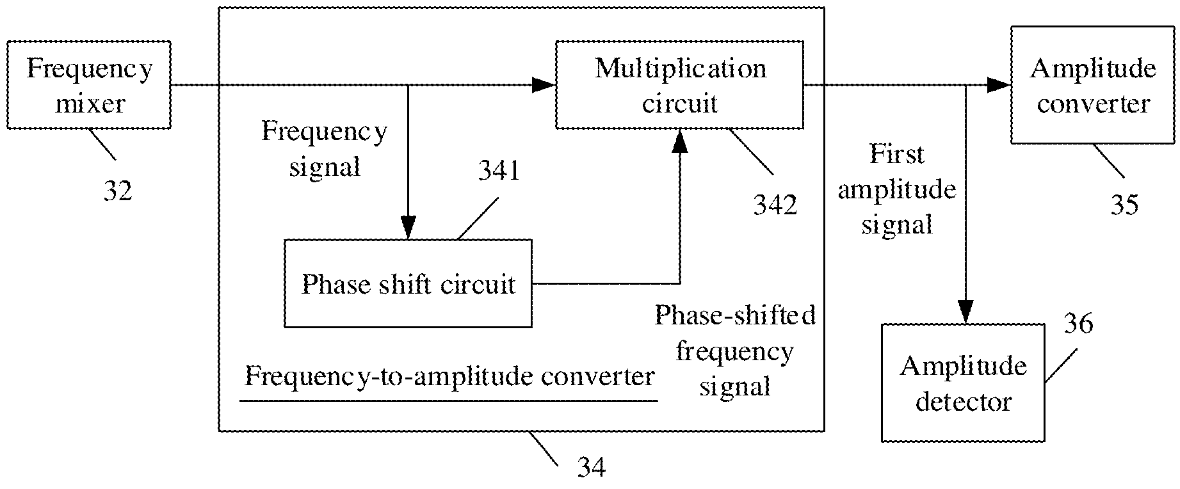
FIG. 8 is a diagram of a structure of a frequency-to-amplitude converter according to an embodiment.

In some possible implementations, as shown in FIG. 7 and FIG. 8, the frequency-to-amplitude converter 34 includes a phase shift circuit 341 and a multiplication circuit 342. An input end of the phase shift circuit 341 and a first input end of the multiplication circuit 342 are separately coupled to an output end of the frequency mixer 32 and are configured to input an intermediate frequency signal that carries a frequency signal. An output end of the phase shift circuit 341 is coupled to a second input end of the multiplication circuit 342. An output end of the multiplication circuit 342 is coupled to the amplitude converter 35 and the amplitude detector 36 as an output end of the frequency-to-amplitude converter 34. The phase shift circuit 341 is configured to perform phase shift on the frequency signal carried in the intermediate frequency signal input to the phase shift circuit 341, to obtain a phase-shifted frequency signal. The multiplication circuit 342 is configured to multiply the frequency signal input to the multiplication circuit by the phase-shifted frequency signal, to obtain a first amplitude signal. An amplitude value of the first amplitude signal indicates a corresponding frequency value of the frequency signal.

Figure 9:
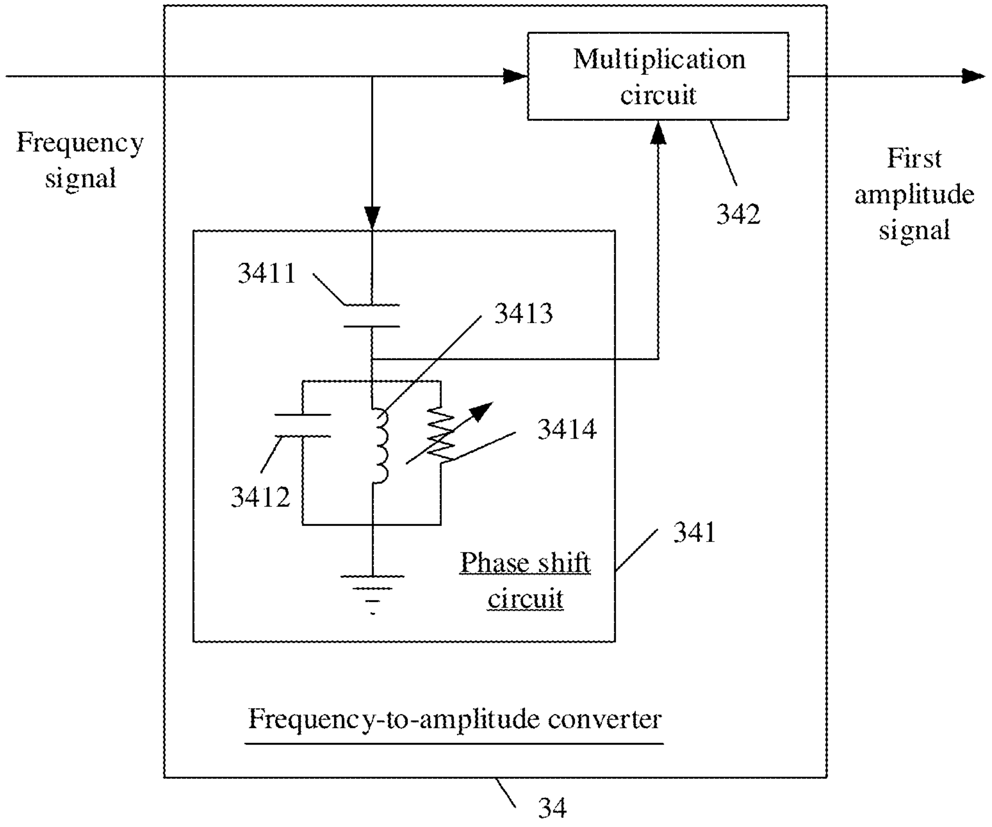
FIG. 9 is a diagram of a structure of another frequency-to-amplitude converter according to an embodiment.

In some possible implementations, as shown in FIG. 7 and FIG. 9, the phase shift circuit 341 includes a first capacitor 3411, a second capacitor 3412, a first inductor 3413, and a first adjustable resistor 3414. A first end of the first capacitor 3411 is coupled to the output end of the frequency mixer 32 as an input end of the phase shift circuit 341, to input an intermediate frequency signal that carries a frequency signal. A second end of the first capacitor 3411 is coupled to a first end of the second capacitor 3412, a first end of the first inductor 3413, and a first end of the first adjustable resistor 3414. A second end of the second capacitor 3412, a second end of the first inductor 3413, and a second end of the first adjustable resistor 3414 are grounded. The second end of the first capacitor 3411 is coupled to the second input end of the multiplication circuit 342 as an output end of the phase shift circuit 341.

For example, when the phase shift circuit 341 shown in FIG. 9 is used, the phase shift circuit 341 includes the first capacitor 3411 and a resonant circuit that are connected in series. A coupling point between the first capacitor 3411 and the resonant circuit is coupled to the multiplication circuit 342 as the output end of the phase shift circuit 341. The resonant circuit includes the second capacitor 3412, the first inductor 3413, and the first adjustable resistor 3414 that are connected in parallel. A resonance frequency of the resonant circuit is as follows:

$$\omega_o = 2\pi f_3 = \frac{1}{\sqrt{LC}},$$

where $f_3$ is a resonance frequency value, and indicates that a phase shift angle of the phase shift circuit 341 for a frequency signal with an input frequency value of $f_3$ is 90°. A calculation formula for a phase shift angle $\Delta\varphi(f)$ for a frequency signal with another input frequency value is as follows:

$$\Delta\varphi(f) = \frac{\pi}{2} - 2Q_p\frac{f - f_3}{f_3}.$$

In the formula, f is a frequency value of a frequency signal input to the phase shift circuit 341, $f_3$ is a frequency value of a frequency signal on which the phase shift circuit 341 can perform 90°-phase-shift, $Q_p$ is a phase shift slope of the phase shift circuit 341 and indicates a range of phase shift angles for frequency signals with different frequency values, and $Q_p=2\pi f_3RC$. R is a resistance of the first adjustable resistor 3414, and C is a capacitance of the second capacitor 3413. Therefore, the phase shift slope of the phase shift circuit 341 can be adjusted by adjusting a value of the resistance of the first adjustable resistor 3414. It can be understood from the foregoing formula that the phase shift circuit 341 can perform phase shift on a frequency signal only by a specific phase interval range. A larger phase shift slope indicates a smaller available range of the frequency value f. On the contrary, a smaller phase shift slope indicates a larger available range of the frequency value f. Therefore, a range of a linear operation interval within which the phase shift circuit 341 can perform phase shift may be adjusted by adjusting the phase shift slope of the phase shift circuit. In this way, a range of the linear operation interval, such as a range of the first frequency interval, of the frequency-to-amplitude converter 34 is adjusted.

For example, as shown in FIG. 9, a circuit including the second capacitor 3412, the first inductor 3413, and the first adjustable resistor 3414 that are connected in parallel is a resonant circuit, and a resonance frequency of the resonant circuit is $\omega_0$. The controller 37 is configured to control a first local oscillator signal output by the frequency generator 33, so that a center frequency value of an actual intermediate frequency signal is equal to $\omega_0/2\pi$, in other words, is equal to the frequency value $f_3$.

Figure 10:
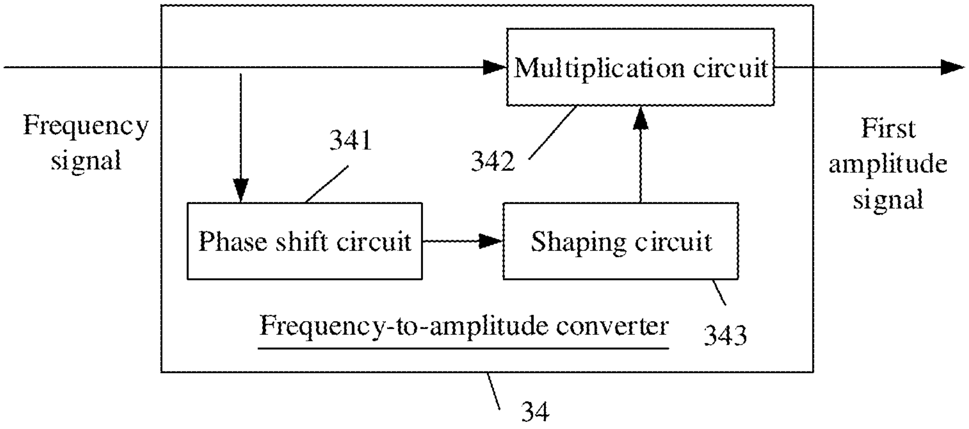
FIG. 10 is a diagram of a structure of another frequency-to-amplitude converter according to an embodiment.

In some possible implementations, as shown in FIG. 10, the frequency-to-amplitude converter 34 further includes a shaping circuit 343. The input end of the phase shift circuit 341 and the first input end of the multiplication circuit 342 each are configured to input one data signal. The data signal carries a frequency signal. The output end of the phase shift circuit 341 is coupled to a first input end of the shaping circuit 343. An output end of the shaping circuit 343 is coupled to the second input end of the multiplication circuit 342. The output end of the multiplication circuit 342 serves as the output end of the frequency-to-amplitude converter 34. The phase shift circuit 341 is configured to perform phase shift on a frequency signal in a data signal input to the phase shift circuit 341, to obtain a phase-shifted frequency signal. The shaping circuit 343 is configured to obtain a first shaped signal based on the phase-shifted frequency signal, where the first shaped signal includes a plurality of fixed amplitude values. The multiplication circuit 342 is configured to obtain a first amplitude signal based on one data signal input to the multiplication circuit 342 and the first shaped signal, where an amplitude value of the first amplitude signal indicates a frequency value corresponding to the frequency signal.

Figure 11:
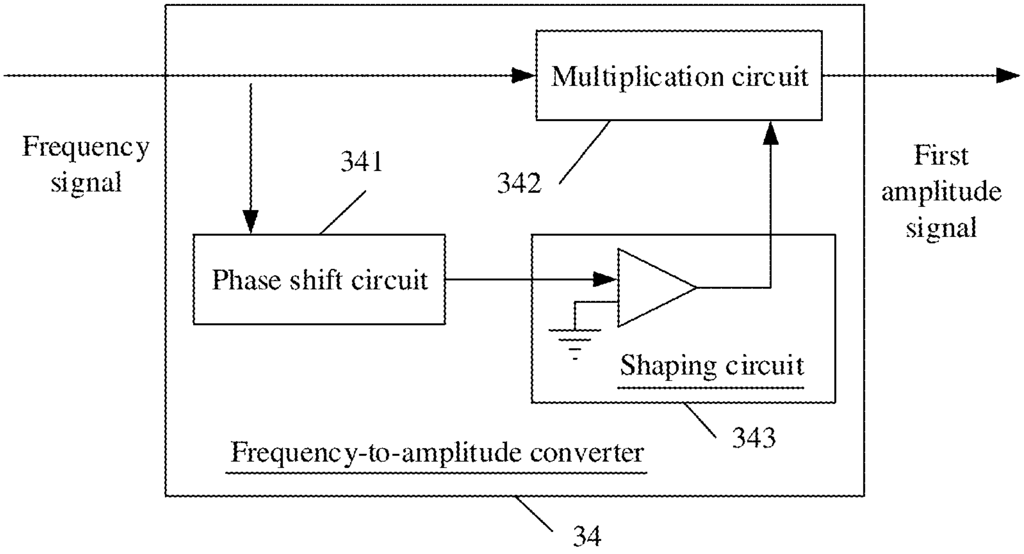
FIG. 11 is a diagram of a structure of another frequency-to-amplitude converter according to an embodiment.

For example, as shown in FIG. 11, the shaping circuit 343 is a first comparator. A first input end of the first comparator is configured to input the phase-shifted frequency signal. A second input end of the first comparator is configured to input a reference voltage. The first comparator compares the phase-shifted frequency signal input to the first input end with the reference voltage. When a signal amplitude (such as a voltage value) of the phase-shifted frequency signal is greater than or equal to the reference voltage, the first comparator outputs a signal with a fixed first amplitude value. When a signal amplitude of the phase-shifted frequency signal is less than the reference voltage, the first comparator outputs a signal with a fixed second amplitude value. The signal with the fixed first amplitude value and/or the signal with the fixed second amplitude value that are output by the first comparator form the first shaped signal.

For example, a data signal input to the frequency-to-amplitude converter 34 shown in FIG. 10 and FIG. 11 may be a baseband signal, an intermediate frequency signal, or a radio frequency signal.

Figure 22:
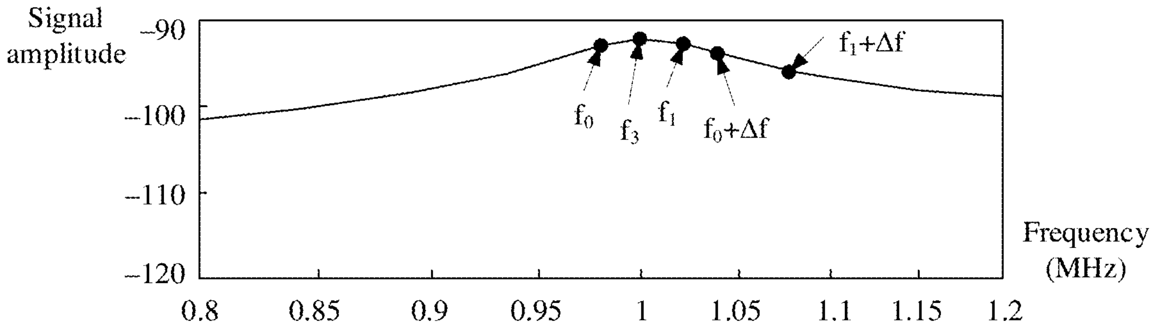
FIG. 22 is a diagram of a frequency-amplitude response curve of a frequency-to-amplitude converter according to an embodiment.
Figure 23:
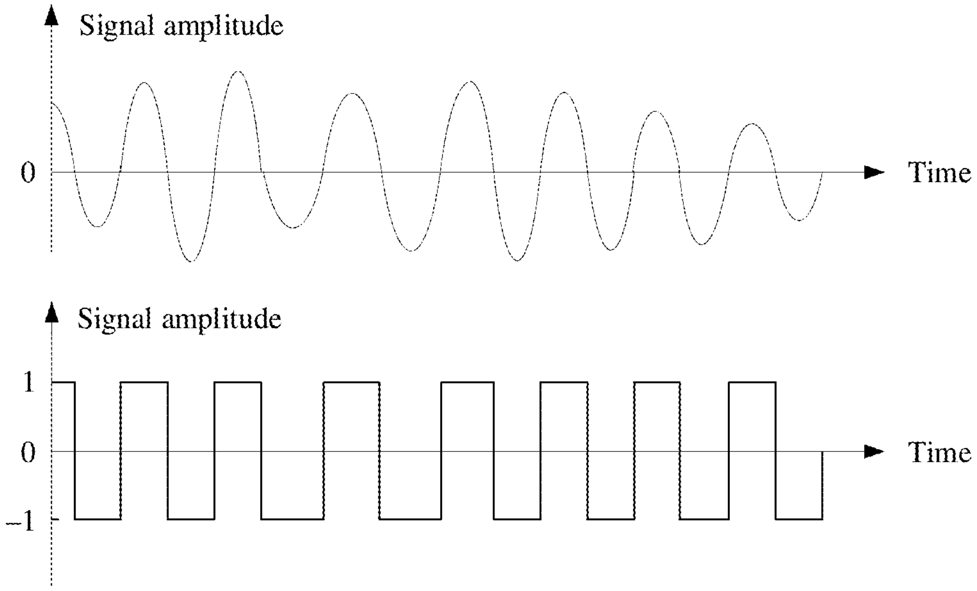
FIG. 23 is a diagram of converting a frequency signal into a shaped signal according to an embodiment.

In this embodiment, the phase shift circuit 341 has different frequency-amplitude responses for different frequency values of a frequency signal. This is manifested as that different frequency values correspond to different signal amplitudes of a phase-shifted frequency signal. FIG. 22 is a frequency-amplitude response curve of the phase shift circuit 341. A highest point of the curve in the figure is a signal amplitude, corresponding to a frequency value $f_3$, of a phase-shifted frequency signal. It can be understood that the frequency-amplitude curve of the phase-shifted frequency signal output by the phase shift circuit 341 is symmetric with respect to the frequency value $f_3$. Therefore, if a frequency value $f_0$ and a frequency value $f_1$ are symmetric with respect to the frequency value $f_3$, a signal amplitude, corresponding to the frequency value $f_0$, of the phase-shifted frequency signal is the same as a signal amplitude, corresponding to the frequency value $f_1$, of the phase-shifted frequency signal. This also facilitates subsequent demodulation. However, when a frequency tolerance is large, for example, the frequency tolerance $\Delta f$ is −0.06 MHz (−60 kHz), an actual frequency value of a frequency signal that corresponds to the frequency value $f_0$ in an ideal case is $f_0+\Delta f$, and an actual frequency value of the frequency signal that corresponds to the frequency value $f_1$ in an ideal case is $f_1+\Delta f$. A signal amplitude, corresponding to the frequency value $f_0+\Delta f$, of the phase-shifted frequency signal is not equal to a signal amplitude, corresponding to the frequency value $f_1+\Delta f$, of the phase-shifted frequency signal. Therefore, for a frequency signal including a plurality of frequency values $f_0$ and frequency values $f_1$, a frequency value of the frequency signal changes between the frequency value $f_0$ and the frequency value $f_1$ with time. In this case, after the frequency signal is input to the phase shift circuit 341, a signal amplitude of a phase-shifted frequency signal output by the phase shift circuit 341 also keeps changing. This affects subsequent demodulation. When a frequency tolerance is large, demodulation even cannot be properly performed. As shown in FIG. 23, an upper side of the figure shows a diagram of a waveform of a phase-shifted frequency signal output by the phase shift circuit 341. The frequency signal may have a problem that a signal amplitude changes irregularly. A lower side of the figure shows a diagram of a waveform of a first shaped signal obtained by shaping the phase-shifted frequency signal that is output by the phase shift circuit 341 and that changes irregularly. The shaping circuit 343 is added. For example, when a reference voltage is a 0 voltage, a part with a signal amplitude greater than the 0 voltage in the frequency signal is output by the shaping circuit 343 as a high level (for example, an amplitude value is 1), and a part with a signal amplitude less than the 0 voltage in the frequency signal is output by the shaping circuit 343 as a low level (for example, an amplitude value is −1), to obtain the first shaped signal shown on the lower side of FIG. 23.

Figure 12:
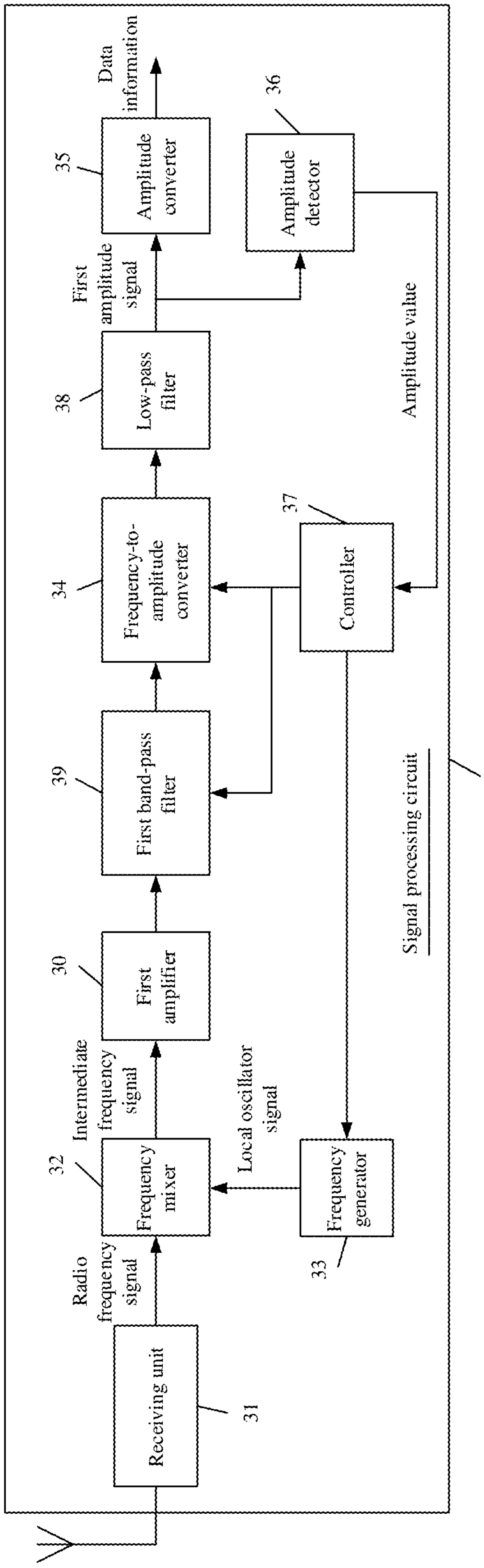
FIG. 12 is a schematic of a structure of a signal processing circuit according to an embodiment.

In some possible implementations, as shown in FIG. 12, the signal processing circuit 3 further includes a low-pass filter 38. An input end of the amplitude detector 36 and an input end of the amplitude converter 35 are coupled to the output end of the frequency-to-amplitude converter 34 through the low-pass filter 38.

For example, a first amplitude signal obtained by some frequency-to-amplitude converters 34 by converting a frequency value into an amplitude value may have a high-frequency component. The high-frequency component causes interference to operation of the amplitude converter 35. Therefore, the low-pass filter 38 is used to filter out the high-frequency component.

In some possible implementations, as shown in FIG. 12, the signal processing circuit 3 further includes a first band-pass filter 39. The frequency-to-amplitude converter 34 is coupled to the output end of the frequency mixer 32 through the first band-pass filter 39. The controller 37 is further coupled to the first band-pass filter 39. The controller 37 is further configured to increase bandwidth of the first band-pass filter 39 or reduce bandwidth of the first band-pass filter 39 based on the value of the frequency tolerance.

For example, intermediate frequency signals may be classified into three types: a broadband intermediate frequency signal, a mid-band intermediate frequency signal, and a narrowband intermediate frequency signal. During actual application, the broadband intermediate frequency signal and the mid-band intermediate frequency signal can share a band-pass filter because a difference between frequency values is small. With the first band-pass filter 39 disposed, different operation modes may be selected. For example, the first band-pass filter 39 is used to filter out an intermediate frequency signal other than the mid-band intermediate frequency signal, or filter out an intermediate frequency signal other than the broadband intermediate frequency signal.

In some possible implementations, as shown in FIG. 12, the signal processing circuit 3 further includes a first amplifier 30. An input end of the first band-pass filter 39 is coupled to the output end of the frequency mixer 32 through the first amplifier 30.

In this embodiment, the first amplifier 30 is configured to amplify an intermediate frequency signal output by the frequency mixer 32, to improve signal quality of the intermediate frequency signal.

Figure 13:
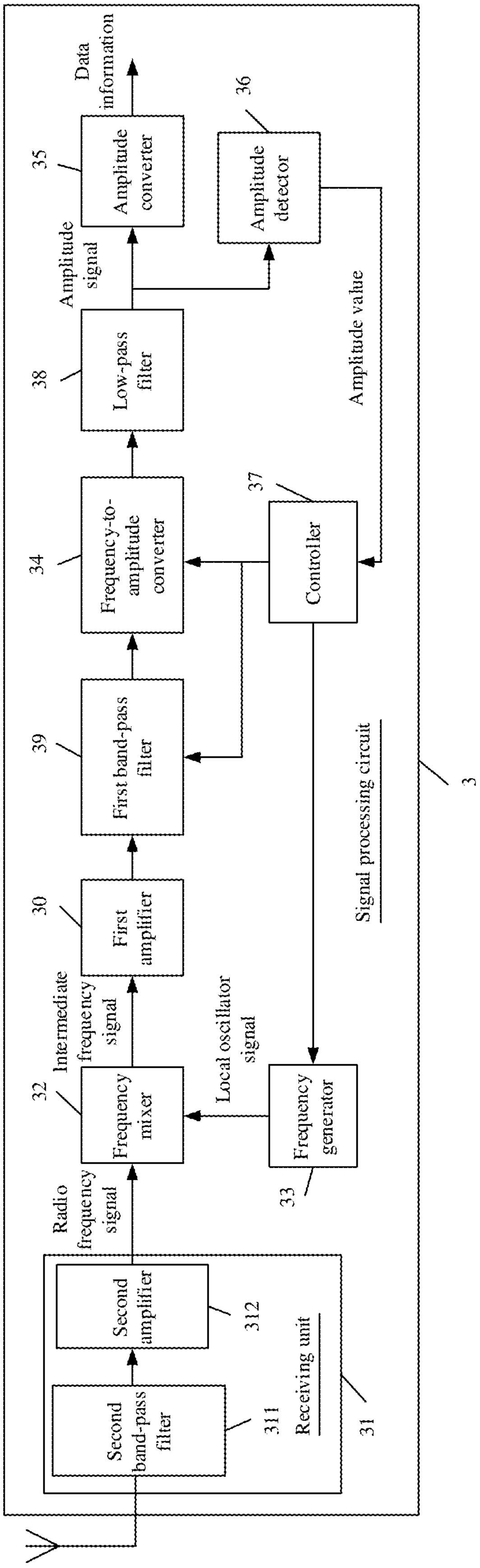
FIG. 13 is a schematic of a structure of another signal processing circuit according to an embodiment.

In some possible implementations, as shown in FIG. 13, the receiving unit 31 includes a second band-pass filter 311 and a second amplifier 312. The second band-pass filter 311 is coupled to the frequency mixer 32 through the second amplifier 312. The second band-pass filter 311 is configured to receive a radio frequency signal, filter the radio frequency signal, and then output a filtered radio frequency signal to the second amplifier 312. The second amplifier 312 is configured to amplify the radio frequency signal and then output an amplified radio frequency signal to the frequency mixer 32.

In this embodiment, the received radio frequency signal may include a signal from another channel, and the second band-pass filter 311 is used to filter out the signal from the another channel. The second amplifier 312 amplifies the radio frequency signal to improve signal quality of the radio frequency signal, so that processing effect of performing, by the frequency mixer 32, down-conversion on the radio frequency signal based on the first local oscillator signal to obtain the intermediate frequency signal is better.

In some possible implementations, the receiving device 2 further includes a receive antenna, and the receive antenna is coupled to the receiving unit 31. The receive antenna is configured to receive a radio frequency signal and output the radio frequency signal to the receiving unit 31.

Figure 14:
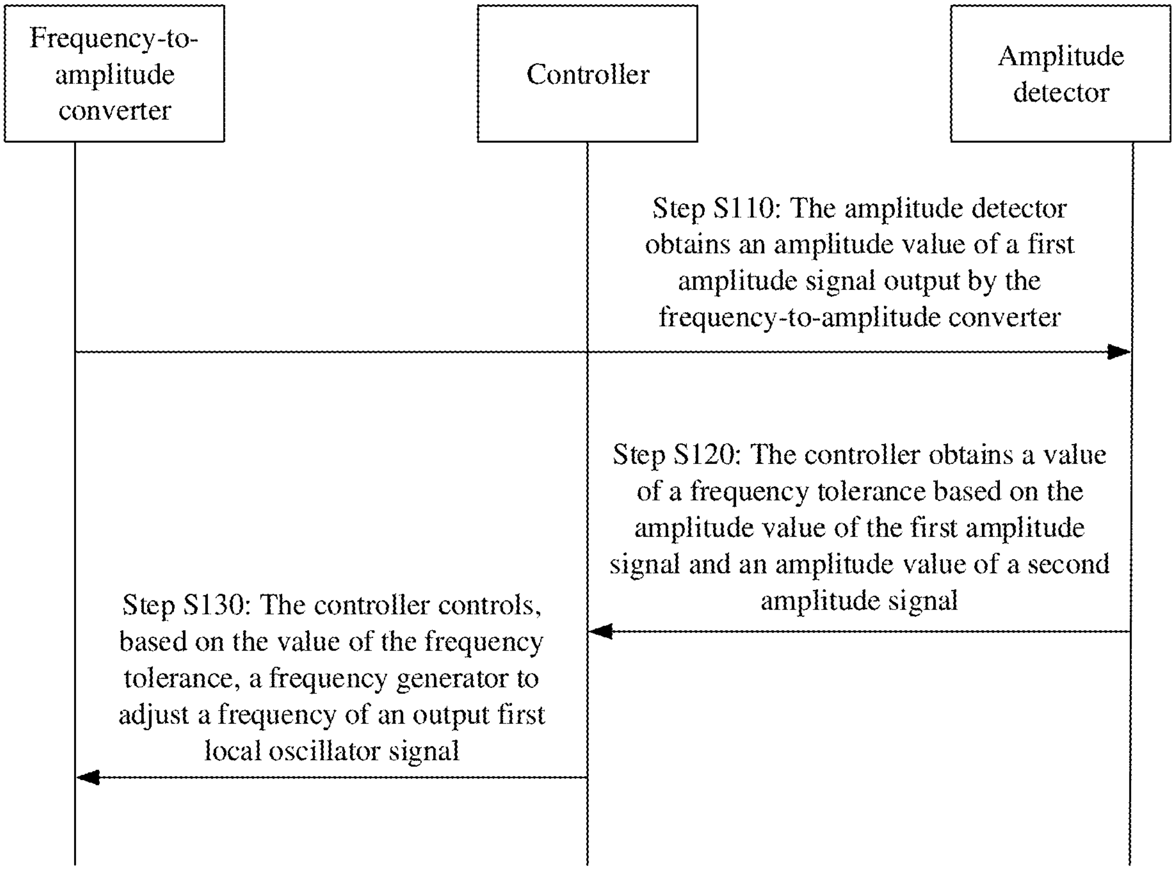
FIG. 14 is a schematic flowchart of a signal processing method according to an embodiment.

The receiving device 2 including the structures shown in FIG. 7, FIG. 8, FIG. 9, FIG. 10, FIG. 11, FIG. 12, and FIG. 13 may be configured to implement the following signal processing method that is shown in FIG. 14 and that includes step S110 to step S130.

Step S110: The amplitude detector 36 obtains an amplitude value of a first amplitude signal output by the frequency-to-amplitude converter 34.

In some possible implementations, in this embodiment, in a scenario in which a frequency shift keying technology is used, the frequency-to-amplitude converter 34 needs to be used when the receiving device 2 performs demodulation. However, a frequency signal and a first amplitude signal are not parameters in an exact linear correspondence. As shown in FIG. 21, for different frequency-to-amplitude converters 34, as an electronic component for converting a frequency signal into an amplitude signal, the frequency-to-amplitude converter 34 has a specific linear operation interval regardless of a range of frequency signals to be converted. Herein, the linear operation interval may be referred to as a first frequency interval. The frequency-to-amplitude converter 34 can convert only a frequency signal within the first frequency interval into a first amplitude signal in a linear relationship with the frequency signal. For a frequency signal that exceeds the frequency interval by a specific range, a frequency value of the frequency signal and an amplitude value of a first amplitude signal begin to have a nonlinear relationship. The frequency interval is referred to as a nonlinear operation interval, and may also be referred to as a second frequency interval. When a frequency difference between a frequency value of a frequency signal and the first frequency interval is quite large, a saturated operation interval is reached, where the saturated operation interval may also be referred to as a third frequency interval. Within the saturated interval, although the frequency value of the frequency signal changes, an amplitude value of a first amplitude signal that is obtained through conversion by the frequency-to-amplitude converter 34 may not change correspondingly, or may change slightly. When a frequency tolerance of a first local oscillator signal makes a frequency value of a frequency signal in an intermediate frequency signal fall within the first frequency interval or the second frequency interval, the amplitude value of the first amplitude signal that is obtained through conversion by the frequency-to-amplitude converter 34 and the frequency value of the frequency signal have a specific correspondence. The value of the frequency tolerance may be calculated based on the correspondence (when the frequency value of the frequency signal is within the first frequency interval, the frequency value and the amplitude value are in a linear relationship; or when the frequency value of the frequency signal is within the second frequency interval, there is a specific deviation between the frequency value and the amplitude value, but the value of the frequency tolerance can still be estimated) and an amplitude value corresponding to a second local oscillator signal.

Figure 15:
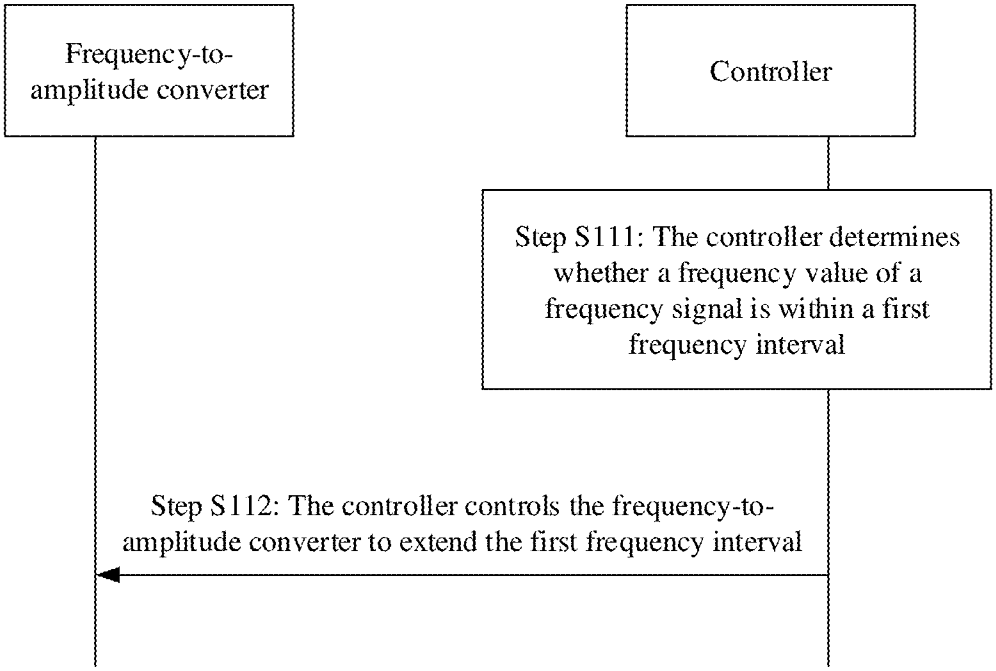
FIG. 15 is a schematic flowchart of another signal processing method according to an embodiment.

Step S110 may include the following step S111 and step S112 shown in FIG. 15.

Step S111: The controller 37 determines whether a frequency value of a frequency signal is within the first frequency interval.

For example, when the amplitude value of the first amplitude signal is not equal to an amplitude value of a second amplitude signal or a difference between the amplitude value of the first amplitude signal and the amplitude value of the second amplitude signal is greater than a first value, the controller 37 may determine that the frequency value of the frequency signal is not within the first frequency interval (such as the linear operation interval). The first value is a preset value, and may be adjusted based on different application scenarios. During actual application, a higher requirement for precision indicates that the first value may be set to a smaller value.

Step S112: The controller 37 controls the frequency-to-amplitude converter 34 to extend the first frequency interval.

In some possible implementations, the frequency value of the frequency signal is not within the first frequency interval (such as the linear operation interval). For example, the frequency value of the frequency signal is within the second frequency interval (such as the nonlinear operation interval) or the third frequency interval (such as the saturated interval). When the frequency value of the frequency signal is not within the first frequency interval, a conversion relationship between a frequency value and an amplitude value is not a linear relationship. To improve processing precision, in this case, the controller 37 may adjust a device parameter of the frequency-to-amplitude converter 34 to extend the first frequency interval (such as the linear operation interval) of the frequency-to-amplitude converter 34, so that the frequency value of the frequency signal is within the first frequency interval. Then the frequency value of the frequency signal is converted to obtain the amplitude value of the first amplitude signal. In this case, the amplitude value and the frequency value are in a linear relationship.

For example, when an absolute value of the difference between the amplitude value of the first amplitude signal and the amplitude value of the second amplitude signal is greater than the first value, the controller 37 may determine that the frequency value of the frequency signal is not within the first frequency interval. In this case, the frequency-to-amplitude converter may be controlled to extend an interval range of the first frequency interval.

In some possible implementations, when the frequency-to-amplitude converter 34 shown in FIG. 8 is used, the phase shift circuit 341 has different frequency-phase responsivity for different frequency values of an input frequency signal. In other words, the phase shift circuit 341 has different phase shift angles for frequency signals with different frequency values. A phase of a frequency signal obtained through phase shift by the phase shift circuit 341 is different from a phase of a frequency signal that exists before the phase shift. Two frequency signals with different phases are input to the multiplication circuit 342 for multiplication to obtain an amplitude value of the first amplitude signal. A plurality of phase-shifted frequency signals that are obtained through phase shift by the phase shift circuit 341 and then output by the phase shift circuit 341 may be multiplied by the frequency signal that exists before the phase shift to obtain a plurality of first amplitude signals with different amplitude values. The controller 37 reduces a value of an angle at which the phase shift circuit 341 performs phase shift on the frequency signal, so that a linear operation interval of the phase shift circuit 341 can be extended. In this way, the phase shift circuit 341 can perform phase shift on a frequency signal within a larger frequency interval range, so that the frequency-to-amplitude converter 34 can perform frequency-to-amplitude conversion on a frequency signal within a larger frequency interval. This extends the first frequency interval.

For example, when the phase shift circuit 341 shown in FIG. 9 is used, the phase shift circuit 341 includes the first capacitor 3411 and a resonant circuit that are connected in series. A coupling point between the first capacitor 3411 and the resonant circuit is coupled to the second input end of the multiplication circuit 342 as the output end of the phase shift circuit 341. The resonant circuit includes the second capacitor 3412, the first inductor 3413, and the first adjustable resistor 3414 that are connected in parallel. A resonance frequency of the resonant circuit is as follows:

$$\omega_0 = 2\pi f_3 = \frac{1}{\sqrt{LC}},$$

where $f_3$ is a frequency value, and indicates that a phase shift angle of the phase shift circuit 341 for a frequency signal with an input frequency value of $f_3$ is 90°. A calculation formula for a phase shift angle $\Delta\varphi(f)$ for a frequency signal with another input frequency value is as follows:

$$\Delta\varphi(f) = \frac{\pi}{2} - 2Q_p\frac{f - f_3}{f_3}.$$

Figure 24:
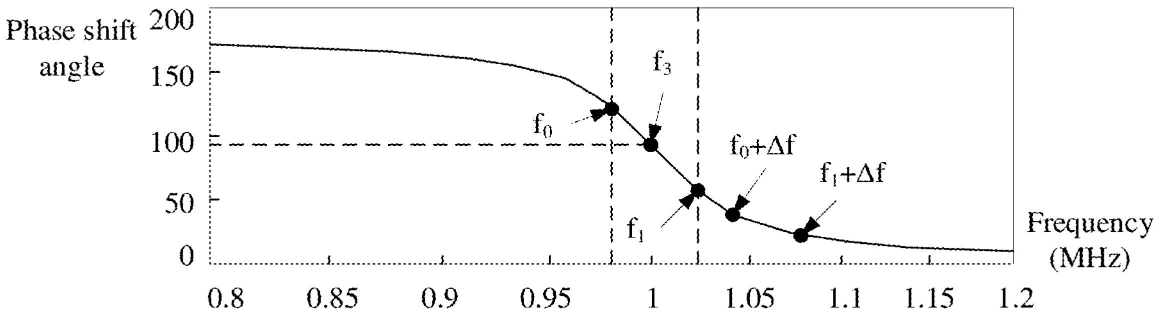
FIG. 24 is a diagram of a frequency-phase response curve of a frequency-to-amplitude converter according to an embodiment.
Figure 25:
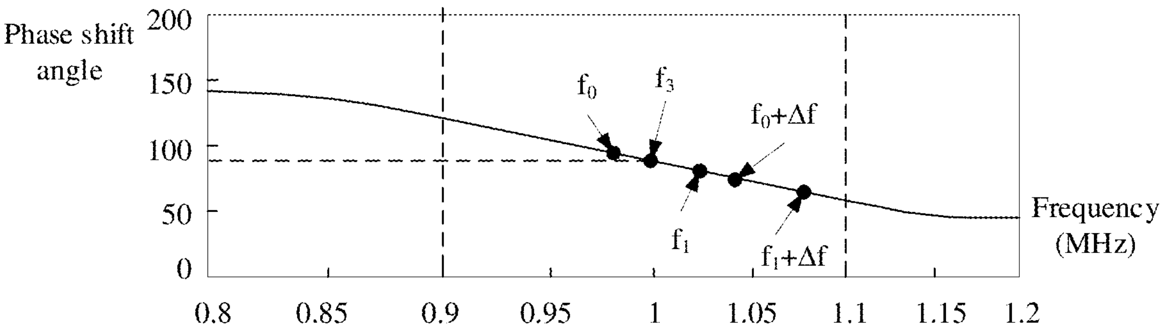
FIG. 25 is a diagram of a frequency-phase response curve of another frequency-to-amplitude converter according to an embodiment.

In the formula, f is a frequency value of a frequency signal input to the phase shift circuit 341, $f_3$ is a frequency value of a frequency signal on which the phase shift circuit 341 can perform 90°-phase-shift, $Q_p$ is a phase shift slope of the phase shift circuit 341 and indicates a range of phase shift angles for frequency signals with different frequency values, and $Q_p=2\pi f_3RC$. R is a resistance of the first adjustable resistor 3414, and C is a capacitance of the second capacitor 3413. Therefore, the phase shift slope of the phase shift circuit 341 can be adjusted by adjusting a value of the resistance of the first adjustable resistor 3414. It can be understood from the foregoing formula that the phase shift circuit 341 can perform phase shift on a frequency signal only by a specific phase interval range. A larger phase shift slope indicates a smaller available range of the frequency value f. On the contrary, a smaller phase shift slope indicates a larger available range of the frequency value f. Therefore, a range of a linear operation interval within which the phase shift circuit 341 can perform phase shift may be adjusted by adjusting the phase shift slope of the phase shift circuit. In this way, a range of the linear operation interval, such as a range of the first frequency interval, of the frequency-to-amplitude converter 34 is adjusted. FIG. 24 is a diagram of an example frequency-phase response curve of the phase shift circuit 341. It can be understood that, when $f_3$ is equal to 1 MHz, a first frequency interval [0.98 MHz, 1.02 MHz] is formed by using $f_3$ as a frequency midpoint of the interval. Within the first frequency interval, a frequency-phase response curve of the phase shift circuit 341 for an input frequency signal is linear. However, within a range of [0.95 MHz, 0.98 MHz) and (1.02 MHz, 1.05 MHz], the frequency-phase response curve for the input frequency signal is nonlinear. This interval range is a nonlinear operation interval, and is also referred to as the second frequency interval. Similarly, within an interval range with a frequency less than 0.95 MHz or a frequency greater than 1.05 MHz, the frequency-phase response curve tends to be smooth. This interval is a saturated interval, and is also referred to as the third frequency interval. Within the saturated interval, as a frequency value of the frequency signal changes, the phase shift circuit 341 slightly changes a phase, or even does not change a phase. When no frequency tolerance is present on the first local oscillator signal, both a frequency value $f_0$ and a frequency value $f_1$ are within the first frequency interval. When a frequency tolerance with a value of $\Delta f$ is present on the first local oscillator signal, both a frequency value $f_0+\Delta f$ and a frequency value $f_1+\Delta f$ are beyond the first frequency interval. As shown in FIG. 25, the resistance of the first adjustable resistor 3413 is reduced, so that a slope of the frequency-phase response curve of the phase shift circuit 341 is reduced, the first frequency interval is extended, and both the frequency value $f_0+\Delta f$ and the frequency value $f_1+\Delta f$ are within the first frequency interval. In this case, an amplitude value corresponding to the frequency value $f_0+\Delta f$ and an amplitude value corresponding to the frequency value $f_1+\Delta f$ are in a linear relationship, and a value of the frequency tolerance can be accurately calculated.

Step S120: The controller 37 obtains the value of the frequency tolerance based on the amplitude value of the first amplitude signal and the amplitude value of the second amplitude signal.

For example, if the first frequency interval of the frequency-to-amplitude converter 34 is not extended, when a frequency value of a frequency signal carried in the first local oscillator signal is within the first frequency interval, the frequency value of the frequency signal is in a linear relationship with the amplitude value of the first amplitude signal, and a difference between a frequency value of the first local oscillator signal and a frequency value of the second local oscillator signal may be calculated based on the difference between the amplitude value of the first amplitude signal and the amplitude value of the second amplitude signal. The first local oscillator signal and the second local oscillator signal may be local oscillator signals with a same frequency value or different frequency values. When the frequency value of the frequency signal carried in the first local oscillator signal is within the second frequency interval (such as the nonlinear operation interval), the value of the frequency tolerance may be estimated based on the difference between the amplitude value of the first amplitude signal and the amplitude value of the second amplitude signal, and a frequency of the first local oscillator signal output by the frequency generator 33 may also be adjusted based on the estimated value of the frequency tolerance.

For example, if the frequency signal carried in the first local oscillator signal is within the second frequency interval (such as the nonlinear operation interval) or the third frequency interval (such as the saturated interval), the first frequency interval is extended, so that the frequency signal carried in the first local oscillator signal is within the first frequency interval. Then the value of the frequency tolerance is obtained based on the difference between the amplitude value of the first amplitude signal and the amplitude value of the second amplitude signal.

In some possible implementations, as shown in FIG. 12, the controller 37 is further configured to increase bandwidth of the first band-pass filter 39 based on the value of the frequency tolerance.

For example, the controller 37 may increase the bandwidth of the first band-pass filter 39 when extending the first frequency interval (such as the linear operation interval) of the frequency-to-amplitude converter 34.

For example, the controller 37 may determine, based on the value of the frequency tolerance, whether the frequency signal is to be filtered out by the first band-pass filter 39, and if it is determined that the frequency signal is to be filtered out by the first band-pass filter 39, increase the bandwidth of the first band-pass filter 39.

In this embodiment, when the frequency tolerance is large, there may be a possibility that the frequency signal is to be filtered out by the first band-pass filter 39. In this case, after calculating the value of the frequency tolerance, the controller 37 increases the bandwidth of the first band-pass filter 39, so that the frequency signal is not to be filtered out by the first band-pass filter 39.

In some possible implementations, the second local oscillator signal is a preset ideal local oscillator signal without a frequency tolerance. An amplitude value of a second amplitude signal that may be obtained by the frequency-to-amplitude converter 34 by converting the second local oscillator signal is obtained through theoretical calculation.

In some possible implementations, the second local oscillator signal is a local oscillator signal that has an accurate frequency value and that is obtained through calibration by using a precision device, and the local oscillator signal is input to the frequency-to-amplitude converter 34 to obtain an amplitude value of a corresponding second amplitude signal.

In some possible implementations, when transmitted data information is binary information, the frequency value $f_0$ corresponds to a value 0, and the frequency value $f_1$ corresponds to a value 1. In this case, the amplitude detector 36 may detect a maximum amplitude value and a minimum amplitude value of the first amplitude signal. The maximum amplitude value is a wave peak of the first amplitude signal, and corresponds to the frequency value $f_1$. The minimum amplitude value is a wave trough of the first amplitude signal, and corresponds to the frequency value $f_0$. The controller 37 calculates a first average value of the maximum amplitude value and the minimum amplitude value of the first amplitude signal. Then a difference between the first average value and a second average value is obtained through comparison, to obtain the value of the frequency tolerance. The second average value is an average value of a maximum amplitude value and a minimum amplitude value of the second amplitude signal.

Step S130: The controller 37 controls, based on the value of the frequency tolerance, the frequency generator 33 to adjust a frequency of the output first local oscillator signal.

In some possible implementations, the controller 37 controls, based on the value of the frequency tolerance, the frequency generator 33 to adjust the frequency of the output first local oscillator signal, so that all frequency values of the frequency signal are within the first frequency interval.

In this embodiment, a frequency tolerance is present on the first local oscillator signal, and the frequency generator 33 is controlled to apply a specific frequency compensation amount to the frequency of the first local oscillator signal to compensate for the frequency tolerance. Directions of the frequency compensation amount and the frequency tolerance are opposite, and frequency values may be equal, but the frequency values are not necessarily equal. During actual application, the frequency tolerance does not necessarily need to be completely compensated for. Provided that the frequency compensation amount can make the frequency value of the frequency signal in the first local oscillator signal fall within the first frequency interval, normal operation of this embodiment can be performed.

In some possible implementations, as shown in FIG. 9, a center frequency value of the intermediate frequency signal is equal to $f_3$, a circuit including the second capacitor 3412, the first inductor 3413, and the first adjustable resistor 3414 that are connected in parallel is a resonant circuit, and a resonance frequency of the resonant circuit is as follows: $\omega_0=2\pi f_3$. An actual frequency of the first local oscillator signal is controlled to be equal to $\omega_0/2\pi=f_3$.

For example, in this embodiment, the directions of the frequency compensation amount and the frequency tolerance are opposite, and the frequency values of the frequency compensation amount and the frequency tolerance are equal.

In this embodiment, it can be understood from the foregoing descriptions that the resonance frequency of the resonant circuit in the phase shift circuit 341 is as follows: $\omega_0=2\pi f_3$, where $f_3$ is a frequency value, and indicates that a phase shift angle of the phase shift circuit 341 for an input frequency signal with a frequency value of $f_3$ is 90°. During actual application, the frequency value of the frequency signal carried in the first local oscillator signal can change by using the first local oscillator signal as a center frequency, for example, during modulation and demodulation of binary data information. If the center frequency value of the intermediate frequency signal is 1 MHz, a value of the frequency value $f_0$ may be as follows: 1 MHz-0.01 MHz=0.99 MHz; and a value of the frequency value $f_1$ may be as follows: 1

MHz+0.01 MHz=1.01 MHz. In a quaternary or hexadecimal system, more frequency values may alternatively be added to correspond to values in different systems. In this case, as shown in FIG. 24 and FIG. 25, when the center frequency value of the intermediate frequency signal is an interval center frequency $f_3$ of the first frequency interval, it can be better ensured that all frequency values of the frequency signal fall within the first frequency interval during adjustment of a size of the interval range of the first frequency interval. In addition, for two frequency values (for example, the frequency value $f_0$ and the frequency value $f_1$) that are symmetric with respect to the frequency midpoint of the interval, as shown in FIG. 22, signal amplitudes of a phase-shifted frequency signal obtained by the phase shift circuit 341 by performing phase shift on the frequency signal are consistent. Therefore, when a first amplitude signal is obtained through multiplication by the multiplication circuit 342, absolute values of signal amplitudes of the first amplitude information that correspond to the frequency values are also consistent. For example, if an amplitude value corresponding to the frequency value $f_3$ is 0, an amplitude value corresponding to the frequency value $f_0$ may be −1, and an amplitude value corresponding to the frequency value $f_1$ may be 1. Absolute values of the signal amplitudes corresponding to the two frequency values are both 1. In this case, the obtained first amplitude signal is also a regularly symmetric signal. A data information result obtained by the amplitude converter 35 by converting the first amplitude signal is also more accurate.

Figure 16:
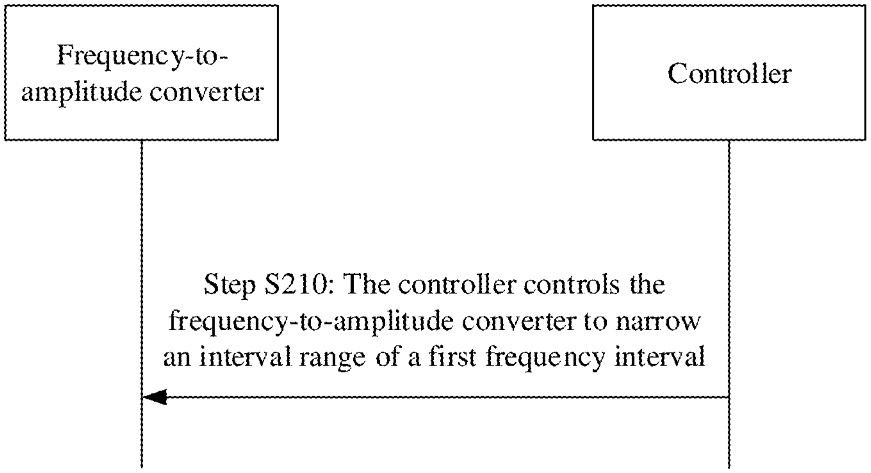
FIG. 16 is a schematic flowchart of another signal processing method according to an embodiment.

The receiving device 2 including the structures shown in FIG. 7, FIG. 8, FIG. 9, FIG. 10, FIG. 11, FIG. 12, and FIG. 13 may be configured to implement the following signal processing method that is shown in FIG. 16 and that includes step S210.

Step S210: The controller 37 controls the frequency-to-amplitude converter 34 to narrow an interval range of a first frequency interval.

In some possible manners, when a frequency value of a frequency signal is within the first frequency interval and a first ratio is greater than a second value, the frequency-to-amplitude converter is controlled to narrow the interval range of the first frequency interval. The first ratio is a ratio of a third value to a fourth value. The third value is a minimum difference between the frequency value of the frequency signal and an interval point frequency of the first frequency interval. The fourth value is a maximum difference between the frequency value of the frequency signal and an interval center frequency of the first frequency interval.

Figure 26:
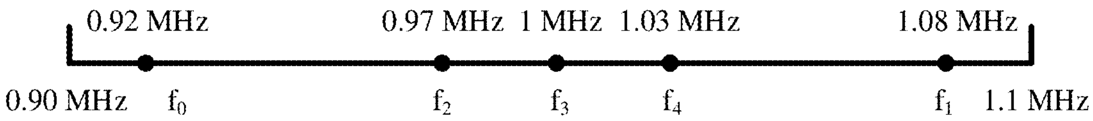
FIG. 26 is a diagram in which frequency values of a frequency signal are symmetrically distributed within a first frequency interval according to an embodiment.

For example, as shown in FIG. 26, if the first frequency interval is [0.90 MHz, 1.1 MHz], the interval center frequency $f_3$ of the first frequency interval is 1 MHz. It is assumed that an input frequency signal has a frequency value $f_0$, a frequency value $f_1$, a frequency value $f_2$, and a frequency value $f_4$ that correspond to 0, 1, 2, and 3 in quaternary data information respectively. In addition, the frequency value $f_0$ is 0.92 MHz, the frequency value $f_1$ is 1.08 MHz, the frequency value $f_2$ is 0.97 MHz, and the frequency value $f_4$ is 1.03 MHz. The first frequency interval has two interval point frequencies: 0.90 MHz and 1.1 MHz. It can be understood that the third value is a minimum difference, such as 0.02 MHz, between the frequency value of the frequency signal and the interval point frequency of the first frequency interval, and the fourth value is a maximum difference, such as 0.08 MHz, between the frequency value of the frequency signal and the interval center frequency of the first frequency interval. In this case, the first ratio is as follows: 0.02 MHz/0.08 MHz=1/4. The value 0.02 MHz of the third value may be a difference between the frequency value $f_0$ and the interval point frequency 0.90 MHz. In this case, the value 0.08 MHz of the fourth value is a difference between the frequency value $f_0$ and the interval center frequency. Alternatively, the value 0.02 MHz of the third value may be a difference between the frequency value $f_1$ and the interval point frequency 1.10 MHz. In this case, the value 0.08 MHz of the fourth value is a difference between the frequency value $f_1$ and the interval center frequency. It can be understood that the first ratio may describe a degree of proximity between the frequency value of the frequency signal and the interval point frequency within the first frequency interval. A larger first ratio indicates a larger distance between the frequency value of the frequency signal and the interval point frequency. This indicates that the current first frequency interval is large.

In this embodiment, as shown in FIG. 24 and FIG. 25, a slope of a frequency-phase response curve in FIG. 25 is less than a slope of a frequency-phase response curve in FIG. 24. It can be understood that a larger interval range of the first frequency interval of the frequency-to-amplitude converter 34 indicates a smaller slope of a frequency-phase response curve of the frequency-to-amplitude converter 34. Similarly, for different frequency values of the frequency signal that are close to each other, an angle difference between phase shift angles is also smaller, and therefore a difference between amplitude values, corresponding to different frequency values, of a first amplitude signal obtained through conversion is also smaller. A smaller difference between different amplitude values of the first amplitude signal also indicates lower demodulation performance. Therefore, in this embodiment, the second value is preset. When the first ratio is greater than the second value, it indicates that the interval range of the first frequency interval is excessively large. In this case, the interval range of the first frequency interval may be appropriately narrowed to achieve better demodulation performance.

In some possible implementations, when a first frequency difference is less than a fifth value, the frequency-to-amplitude converter is controlled to narrow the interval range of the first frequency interval. The first frequency difference is an absolute value of a difference between a maximum frequency value and a minimum frequency value of a frequency signal carried in a first local oscillator signal.

In this embodiment, the first frequency difference is the difference between the maximum frequency value and the minimum frequency value of the frequency signal. For example, as shown in FIG. 26, the first frequency difference is a difference between the frequency value $f_1$ and the frequency value $f_0$. A smaller first frequency difference indicates a smaller difference between different amplitude values of the first amplitude signal obtained through conversion, and indicates that higher demodulation precision is needed for the first amplitude signal. Therefore, when the first frequency difference is less than the preset fifth value, the controller 37 may control the frequency-to-amplitude converter 34 to narrow the interval range of the first frequency interval, to improve demodulation performance.

For an implementation of controlling, by the controller 37, the frequency-to-amplitude converter 34 to narrow the interval range of the first frequency interval, refer to the foregoing implementation of controlling, by the controller 37, the frequency-to-amplitude converter 34 to extend the interval range of the first frequency interval. Therefore, details are not described herein again.

Figure 27:
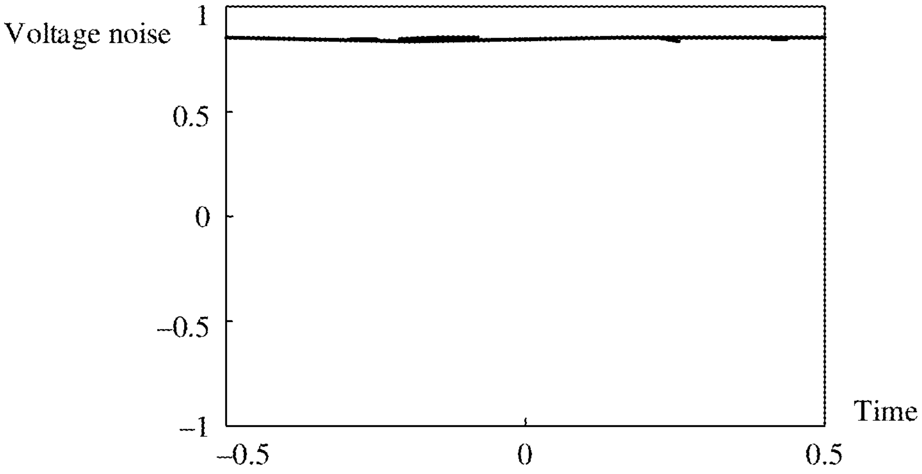
FIG. 27 is a diagram of an eye diagram of another receiving device according to an embodiment.
Figure 28:
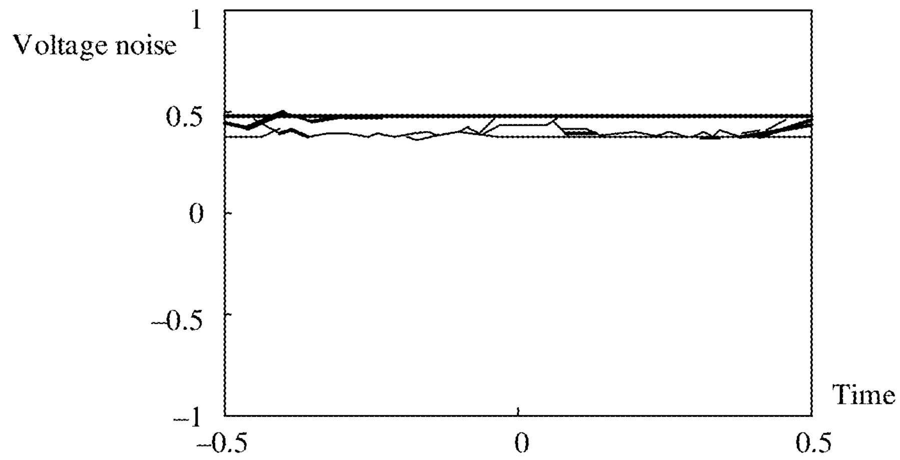
FIG. 28 is a diagram of an eye diagram of another receiving device according to an embodiment.
Figure 29:
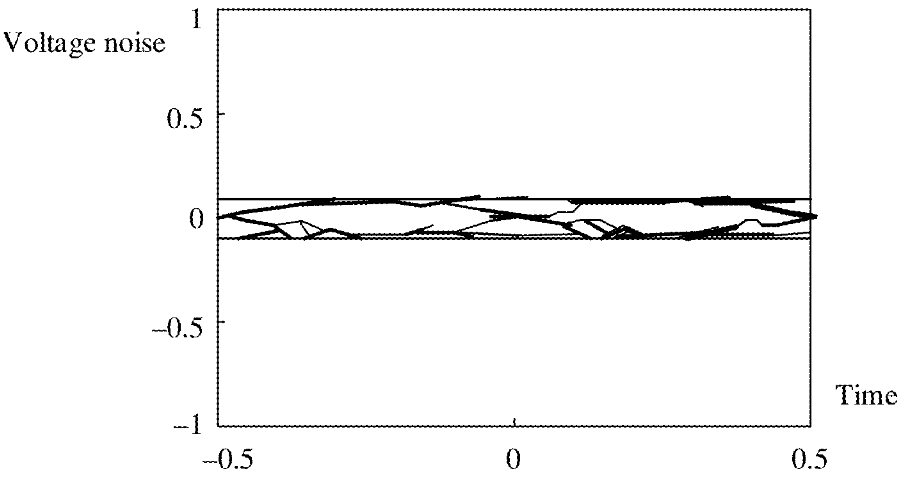
FIG. 29 is a diagram of an eye diagram of another receiving device according to an embodiment.
Figure 30:
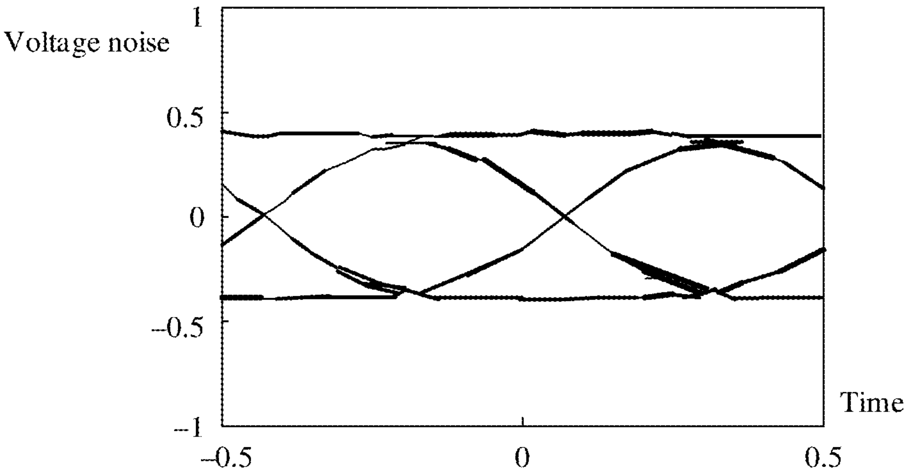
FIG. 30 is a diagram of an eye diagram of another receiving device according to an embodiment.

For example, when the frequency-to-amplitude converter 34 shown in FIG. 9 and FIG. 10 is used, FIG. 27 is an eye diagram of the receiving device 2 in a case in which a resistance of the first adjustable resistor 3414 is 10 kΩ and a value of a frequency tolerance is 90 kHz. It can be understood that, in this case, the frequency value of the frequency signal is within a saturated interval of the frequency-to-amplitude converter 34, and demodulation cannot be properly performed. FIG. 28 is an eye diagram of the receiving device 2 in a case in which the resistance of the first adjustable resistor 3414 is reduced from 10 kΩ to 2 kΩ. It can be understood that the first frequency interval (such as a linear operation interval) of the frequency-to-amplitude converter 34 is extended by reducing the resistance of the first adjustable resistor 3414. In this case, the frequency value of the frequency signal is within the linear operation interval of the frequency-to-amplitude converter 34. Although the eye diagram is not open to a large degree, because the frequency value of the frequency signal is within the first frequency interval, the value of the frequency tolerance, such as 90 kHz, can be calculated. FIG. 29 is an eye diagram of the receiving device 2 that is obtained after the controller 37 controls the frequency generator 33 to compensate for a frequency of the first local oscillator signal. In this case, a frequency tolerance may be considered as 0. It can be understood that, compared with the eye diagram that exists before compensation is performed on the first local oscillator signal, the eye diagram is open to a larger degree, and demodulation performance is better. However, because the first frequency interval is extended, after the first local oscillator signal is compensated for, a value of the first ratio is quite large. In this case, demodulation performance does not reach an ideal state. FIG. 30 is an eye diagram of the receiving device 2 in a case in which the controller 37 increases the resistance of the first adjustable resistor 3414 from 2 kΩ to 10 kΩ. It can be understood that, after the first frequency interval is narrowed, the eye diagram is open to a larger degree, and demodulation performance is better.

In this embodiment, the first frequency interval is extended to obtain a precise value of a frequency tolerance, and after compensation is performed on the first local oscillator signal based on the value of the frequency tolerance, the first frequency interval may be narrowed, to achieve better demodulation performance. Similarly, when the first frequency interval is not extended, if it is detected that the interval range of the first frequency interval is relatively large or the absolute value of the difference between the maximum frequency value and the minimum frequency value of the frequency signal is small, the controller 37 may alternatively control the frequency-to-amplitude converter 34 to narrow the range of the first frequency interval, to improve demodulation performance.

For example, before the frequency tolerance of the first local oscillator signal is compensated for, the controller 37 increases bandwidth of the first band-pass filter 39 shown in FIG. 12 and FIG. 13. In this case, after the frequency tolerance of the first local oscillator signal is compensated for, the controller 37 may reduce the bandwidth of the first band-pass filter 39, to achieve better demodulation performance.

In this embodiment, in the receiving device with the structures shown in FIG. 7, FIG. 8, FIG. 9, FIG. 10, FIG. 11, FIG. 12, and FIG. 13, the amplitude detector is disposed to detect an amplitude value of a first amplitude signal output by the frequency-to-amplitude converter, to obtain a value of a frequency tolerance of a first local oscillator signal, and the controller controls the frequency generator to adjust a frequency of the output first local oscillator signal, to avoid a problem that demodulation is inaccurate or demodulation cannot be performed because a frequency signal carried in an intermediate frequency signal is beyond a linear operation interval of the frequency tolerance-to-amplitude converter due to the frequency tolerance. In addition, in this embodiment, when the frequency-to-amplitude converter shown in FIG. 9 is used, amplitudes of frequency signals output by the phase shift circuit vary due to the frequency tolerance. Consequently, amplitude values obtained by the frequency-to-amplitude converter change irregularly. This increases difficulty in demodulation, or demodulation even cannot be properly performed. In this case, as shown in FIG. 10 and FIG. 11, the shaping circuit is added to the frequency-to-amplitude converter. The shaping circuit converts all frequency signals output by the phase shift circuit into regular signals, and then the multiplication circuit outputs a regular first amplitude signal. This further reduces impact of the frequency tolerance on demodulation.

Figure 31:
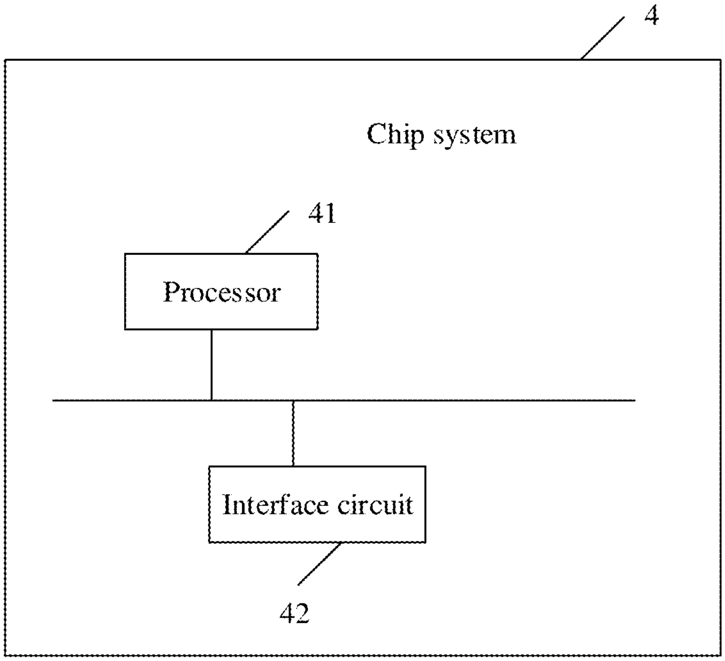
FIG. 31 is a diagram of a structure of a chip system according to an embodiment.

As shown in FIG. 31, an embodiment further provides a chip system 4. The chip system 4 includes at least one processor 41 and at least one interface circuit 42. The at least one processor 41 and the at least one interface circuit 42 may be interconnected through a line. The processor 41 is configured to support the chip system 4 in implementing the functions or the steps in the foregoing method embodiments, for example, performing the methods shown in FIG. 14, FIG. 15, and FIG. 16. The at least one interface circuit 42 may be configured to receive a signal from another apparatus (for example, a memory), or send a signal to another apparatus (for example, a communication interface). The chip system 4 may include a chip, and may further include another discrete component.

An embodiment further provides a non-transitory computer-readable storage medium. The non-transitory computer-readable storage medium includes instructions. When the instructions are run on the foregoing chip system or receiving device, the chip system or the receiving device is enabled to perform the functions or the steps in the foregoing method embodiments, for example, perform the methods shown in FIG. 14, FIG. 15, and FIG. 16.

An embodiment further provides a computer program product including instructions. When the instructions are run on the foregoing chip system or electronic device, the chip system or the electronic device is enabled to perform the functions or the steps in the foregoing method embodiments, for example, perform the methods shown in FIG. 14, FIG. 15, and FIG. 16.

For effects of the chip system, the non-transitory computer-readable storage medium, and the computer program product, refer to at least the effects of the foregoing method embodiments.

The controller in embodiments may be a chip. For example, the controller may be a field programmable gate array (FPGA), an application-specific integrated chip (ASIC), a system on chip (SoC), a central controller (CPU), a network controller (NP), a digital signal processing circuit (DSP), a micro controller unit (MCU), a programmable controller (PLD), or another integrated chip.

It should be understood that sequence numbers of the foregoing processes do not mean execution sequences in embodiments. The execution sequences of the processes should be determined based on functions and internal logic of the processes, and should not constitute any limitation on implementation processes of embodiments.

A person of ordinary skill in the art may be aware that modules and algorithm steps in examples described with reference to embodiments can be implemented by electronic hardware or a combination of computer software and electronic hardware. Whether the functions are performed by hardware or software depends on particular applications and design constraints of solutions. A person skilled in the art may use different methods to implement the described functions for each particular application, but it should not be considered that the implementation goes beyond the scope of the embodiments.

It can be clearly understood by a person skilled in the art that, for ease and brevity of description, for detailed working processes of the foregoing system, apparatus, and module, reference may be made to corresponding processes in the foregoing method embodiments. Details are not described herein again.

In several embodiments provided, it should be understood that the system, device, and method may be implemented in other manners. For example, the described device embodiments are merely examples. For example, division into the modules is merely logical function division, and may be other division in an actual implementation. For example, a plurality of modules or components may be combined or may be integrated into another device, or some features may be ignored or not performed. In addition, the shown or discussed mutual couplings or direct couplings or communication connections may be implemented through some interfaces. The indirect couplings or communication connections between the devices or modules may be implemented in electronic, mechanical, or other forms.

The modules described as separate components may or may not be physically separate, and components shown as modules may or may not be physical modules, for example, may be located in one device, or may be distributed in a plurality of devices. Some or all of the modules may be selected according to actual requirements to achieve objectives of solutions of embodiments.

In addition, functional modules in embodiments may be integrated into one device, or each of the modules may exist alone physically, or two or more modules may be integrated into one device.

All or some of the foregoing embodiments may be implemented by software, hardware, firmware, or any combination thereof. When a software program is used to implement the embodiments, some or all of the embodiments may be implemented in a form of a computer program product. The computer program product includes one or more computer instructions. When the computer program instructions are loaded and executed on a computer, all or some of processes or functions according to embodiments are generated. The computer may be a general-purpose computer, a dedicated computer, a computer network, or another programmable apparatus. The computer instructions may be stored in a non-transitory computer-readable storage medium or may be transmitted from a non-transitory computer-readable storage medium to another non-transitory computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The non-transitory computer-readable storage medium may be any usable medium accessible to a computer, or a data storage device, for example, a server or a data center, integrating one or more usable media. The usable medium may be a magnetic medium (for example, a floppy disk, a hard disk drive, or a magnetic tape), an optical medium (for example, a DVD), a semiconductor medium (for example, a solid-state drive (SSD)), or the like.

The foregoing descriptions are merely specific implementations of the embodiments, but are not intended to limit their scope. Any variation or replacement readily figured out by a person skilled in the art shall fall within the scope of embodiments.

The invention claimed is:

1. A circuit comprising:

an amplitude detector;

a frequency-to-amplitude converter coupled to the amplitude detector;

a frequency mixer coupled to the frequency-to-amplitude converter and configured to:

input a radio frequency signal and a first local oscillator signal, and perform frequency mixing on the radio frequency signal and the first local oscillator signal to obtain an intermediate frequency signal that carries a frequency signal;

a frequency generator coupled to the frequency mixer and configured to output the first local oscillator signal with a frequency tolerance to the frequency mixer; and a controller, wherein the amplitude detector and the frequency generator are separately coupled to the controller, the frequency-to-amplitude converter is configured to obtain a first amplitude signal based on the frequency signal, the amplitude detector is configured to obtain an amplitude value of the first amplitude signal, and the controller is configured to:

obtain a value of the frequency tolerance based on the amplitude value of the first amplitude signal and an amplitude value of a second amplitude signal, wherein the second amplitude signal corresponds to a frequency signal carried in a second local oscillator signal and the second local oscillator signal does not carry the frequency tolerance; and control, based on the value of the frequency tolerance, the frequency generator to adjust a frequency value of the first local oscillator signal.

2. The circuit according to claim 1, wherein for the frequency-to-amplitude converter, when a frequency value of a frequency signal input to the frequency-to-amplitude converter is within a first frequency interval, an amplitude value of an amplitude signal output by the frequency-to-amplitude converter is in a linear relationship with the frequency value of the frequency signal correspondingly input to the frequency-to-amplitude converter, the frequency tolerance indicates an offset between a frequency value of the first local oscillator signal and the first frequency interval, and the controller is further configured to:

control, based on the value of the frequency tolerance, the frequency generator to adjust a frequency value of the output first local oscillator signal, so that a frequency value of the frequency signal is within the first frequency interval.

3. The circuit according to claim 2, wherein the controller is further configured to:

when an absolute value of a difference between the amplitude value of the first amplitude signal and the amplitude value of the second amplitude signal is greater than a first value, control the frequency-to-amplitude converter to extend an interval range of the first frequency interval.

4. The circuit according to claim 3, wherein the frequency-to-amplitude converter further comprises:

a phase shift circuit; and a multiplication circuit, an input end of the phase shift circuit and a first input end of the multiplication circuit are separately coupled to an output end of the frequency mixer and are configured to input the frequency signal, an output end of the phase shift circuit is coupled to a second input end of the multiplication circuit, an output end of the multiplication circuit is coupled to the amplitude detector as an output end of the frequency-to-amplitude converter, the phase shift circuit is configured to:

perform a phase shift on the frequency signal input to the phase shift circuit, to obtain the phase-shifted frequency signal, and the multiplication circuit is configured to:

obtain the first amplitude signal by using the frequency signal input to the multiplication circuit and the phase-shifted frequency signal; and the controller is further configured to:

reduce a value of an angle at which the phase shift circuit performs the phase shift on the frequency signal, to extend the interval range of the first frequency interval.

5. The circuit according to claim 4, wherein the phase shift circuit further comprises:

a first capacitor, a first end of the first capacitor is coupled to the output end of the frequency mixer as an input end of the phase shift circuit and a second end of the first capacitor is coupled to the multiplication circuit as an output end of the phase shift circuit;

a second capacitor, a first inductor, and a first adjustable resistor, a second end of the first capacitor is coupled to a first end of the second capacitor, a first end of the first inductor, and a first end of the first adjustable resistor, a second end of the second capacitor, a second end of the first inductor, and a second end of the first adjustable resistor are grounded; and the controller is further configured to:

adjust a resistance of the first adjustable resistor, and adjust the value of the angle at which the phase shift circuit performs the phase shift on the frequency signal.

6. The circuit according to claim 4, wherein the frequency-to-amplitude converter further comprises:

a first comparator, a first input end of the first comparator is coupled to the output end of the phase shift circuit, a second input end of the first comparator is configured to input a reference voltage, and an output end of the first comparator is coupled to the second input end of the multiplication circuit.

7. The circuit according to claim 2, wherein the controller is further configured to:

when the frequency value of the frequency signal is within the first frequency interval and a first ratio is greater than a second value, control the frequency-to-amplitude converter to narrow the interval range of the first frequency interval, wherein the first ratio is a ratio of a third value to a fourth value, the third value is a minimum difference between the frequency value of the frequency signal and an interval point frequency of the first frequency interval, and the fourth value is a maximum difference between the frequency value of the frequency signal and an interval center frequency of the first frequency interval.

8. The circuit according to claim 7, wherein the frequency-to-amplitude converter further comprises;

a phase shift circuit and a multiplication circuit, an input end of the phase shift circuit and a first input end of the multiplication circuit are separately coupled to an output end of the frequency mixer and are configured to input the frequency signal, an output end of the phase shift circuit is coupled to a second input end of the multiplication circuit, an output end of the multiplication circuit is coupled to the amplitude detector as an output end of the frequency-to-amplitude converter, the phase shift circuit is configured to:

perform a phase shift on the frequency signal input to the phase shift circuit, to obtain the phase-shifted frequency signal, and the multiplication circuit is configured to:

obtain the first amplitude signal by using the frequency signal input to the multiplication circuit and the phase-shifted frequency signal; and the controller is further configured to:

increase a value of an angle at which the phase shift circuit performs the phase shift on the frequency signal, to narrow the interval range of the first frequency interval.

9. The circuit according to claim 2, wherein the controller is further configured to:

when a first frequency difference is less than a fifth value, control the frequency-to-amplitude converter to narrow the interval range of the first frequency interval, wherein the first frequency difference is an absolute value of a difference between a maximum frequency value and a minimum frequency value of a frequency signal carried in the first local oscillator signal.

10. The circuit according to claim 2, wherein a center frequency value of the intermediate frequency signal is equal to the interval center frequency of the first frequency interval.

11. The circuit according to claim 1, wherein the signal processing circuit further comprises an amplitude converter coupled to the output end of the frequency-to-amplitude converter and configured to obtain corresponding data information based on the amplitude value of the first amplitude signal.

12. The circuit according to claim 11, wherein the signal processing circuit further comprises:

a low-pass filter, and an input end of the amplitude detector and an input end of the amplitude converter are coupled to the output end of the frequency-to-amplitude converter through the low-pass filter.

13. The circuit according to claim 1, wherein the signal processing circuit further comprises:

a first band-pass filter, and the frequency-to-amplitude converter is coupled to the output end of the frequency mixer through the first band-pass filter; and the controller is further configured to:

increase or reduce a bandwidth of the first band-pass filter based on the value of the frequency tolerance.

14. The circuit according to claim 13, wherein the signal processing circuit further comprises:

a first amplifier, and an input end of the first band-pass filter is coupled to the output end of the frequency mixer through the first amplifier.

15. The circuit according to claim 1, wherein the signal processing circuit further comprises:

a receiving unit configured to:

receive the radio frequency signal and output the radio frequency signal to the frequency mixer.

16. The circuit according to claim 15, wherein the receiving unit further comprises a second band-pass filter and a second amplifier, the second band-pass filter is coupled to the frequency mixer through the second amplifier, and the second band-pass filter is configured to receive the radio frequency signal.

17. An electronic device, comprising a signal processing circuit comprising:

an amplitude detector;

a frequency-to-amplitude converter coupled to the amplitude detector;

a frequency mixer coupled to the frequency-to-amplitude converter and configured to:

input a radio frequency signal and a first local oscillator signal, and perform frequency mixing on the radio frequency signal and the first local oscillator signal to obtain an intermediate frequency signal that carries a frequency signal;

a frequency generator coupled to the frequency mixer and configured to output the first local oscillator signal with a frequency tolerance to the frequency mixer; and a controller, wherein the amplitude detector and the frequency generator are separately coupled to the controller, the frequency-to-amplitude converter is configured to obtain a first amplitude signal based on the frequency signal, the amplitude detector is configured to obtain an amplitude value of the first amplitude signal, and the controller is configured to:

obtain a value of the frequency tolerance based on the amplitude value of the first amplitude signal and an amplitude value of a second amplitude signal, wherein the second amplitude signal is an amplitude signal corresponding to a frequency signal carried in a second local oscillator signal, and the second local oscillator signal does not carry the frequency tolerance; and control, based on the value of the frequency tolerance, the frequency generator to adjust a frequency value of the output first local oscillator signal.

18. The electronic device according to claim 17, wherein for the frequency-to-amplitude converter, when a frequency value of a frequency signal input to the frequency-to-amplitude converter is within a first frequency interval, an amplitude value of an amplitude signal output by the frequency-to-amplitude converter is in a linear relationship with the frequency value of the frequency signal correspondingly input to the frequency-to-amplitude converter, the frequency tolerance indicates an offset between a frequency value of the first local oscillator signal and the first frequency interval, and the controller is further configured to:

control, based on the value of the frequency tolerance, the frequency generator to adjust a frequency value of the output first local oscillator signal, so that a frequency value of the frequency signal is within the first frequency interval.

19. The electronic device according to claim 18, wherein the controller is further configured to:

when an absolute value of a difference between the amplitude value of the first amplitude signal and the amplitude value of the second amplitude signal is greater than a first value, control the frequency-to-amplitude converter to extend an interval range of the first frequency interval.

20. The electronic device according to claim 18, wherein the controller is further configured to:

when the frequency value of the frequency signal is within the first frequency interval and a first ratio is greater than a second value, control the frequency-to-amplitude converter to narrow the interval range of the first frequency interval, wherein the first ratio is a ratio of a third value to a fourth value, the third value is a minimum difference between the frequency value of the frequency signal and an interval point frequency of the first frequency interval, and the fourth value is a maximum difference between the frequency value of the frequency signal and an interval center frequency of the first frequency interval.

* * * * *